(12) United States Patent
Joet

(10) Patent No.: US 7,671,780 B2
(45) Date of Patent: *Mar. 2, 2010

(54) METHOD AND DEVICE FOR PROCESSING AN INCIDENT SIGNAL, IN PARTICULAR FOR FREQUENCY TRANSPOSITION

(75) Inventor: Loïc Joet, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 105 days.

This patent is subject to a terminal disclaimer.

(21) Appl. No.: 12/015,070

(22) Filed: Jan. 16, 2008

(65) Prior Publication Data

US 2008/0186219 A1 Aug. 7, 2008

(30) Foreign Application Priority Data

Jan. 17, 2007 (FR) .................................. 07 52721
Jan. 9, 2008 (FR) .................................. 08 50114

(51) Int. Cl.
*H03M 1/12* (2006.01)

(52) U.S. Cl. ...................... 341/172; 341/155; 375/316

(58) Field of Classification Search ................. 341/155; 375/316
See application file for complete search history.

(56) References Cited

U.S. PATENT DOCUMENTS

| 6,535,553 | B1 | 3/2003 | Limberg et al. ............. 375/232 |
| 6,584,157 | B1 * | 6/2003 | Van Der Zwan et al. .... 375/247 |
| 6,879,817 | B1 | 4/2005 | Sorrells et al. .............. 455/296 |
| 2004/0002311 | A1 | 1/2004 | Feng ....................... 455/194.2 |

* cited by examiner

*Primary Examiner*—Khai M Nguyen
(74) *Attorney, Agent, or Firm*—Lisa K. Jorgenson; Allen, Dyer, Doppelt, Milbrath & Gilchrist P.A.

(57) ABSTRACT

A method is for processing an incident signal, in which the incident signal is delivered to a transconductor stage, and a current output of the transconductor stage is coupled to an output capacitor so as to deliver to the output capacitor a current signal lasting for at least part of the first half-period of each period of a periodic signal and to thus obtain a frequency-transposed signal at the output capacitor. Upon the occurrence of each part of the first half-period, the voltage of the current output, seen from the output capacitor, is reset to a value equal to that of the voltage of the output capacitor.

46 Claims, 18 Drawing Sheets

FIG.11
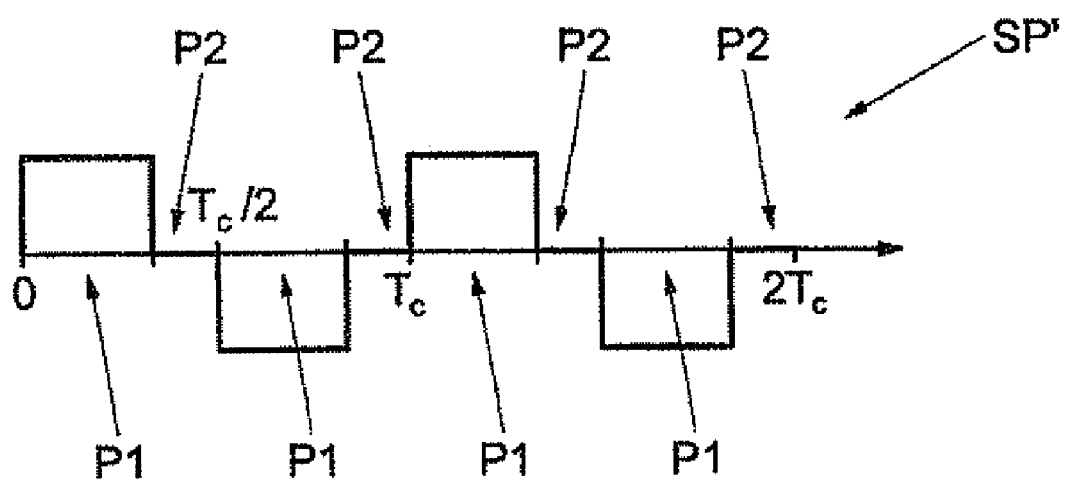
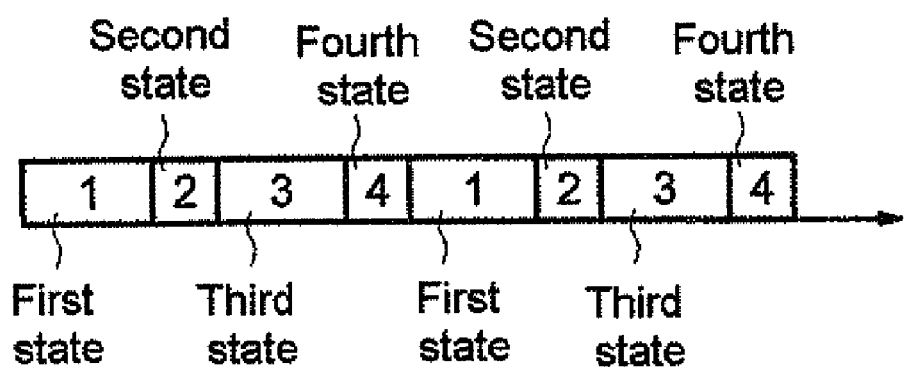

METHOD AND DEVICE FOR PROCESSING AN INCIDENT SIGNAL, IN PARTICULAR FOR FREQUENCY TRANSPOSITION

FIELD OF THE INVENTION

The present invention relates to the processing of an analog signal, and more particularly the frequency transposition of such a signal.

The invention may be advantageously applied to, but is not limited to, the processing of signals, in particular radiofrequency signals comprising a plurality of frequency channels and undergoing one or more frequency transpositions in order to select a particular channel and down-convert it to baseband. This is the case, for example, for terrestrial digital television signals, or more generally for signals carried in frequency-multiplexed transmission systems.

BACKGROUND OF THE INVENTION

An incident analog signal, for example comprising information situated within a desired frequency range (desired channel, for example), and frequency components situated outside of the desired frequency range (channels adjacent to the desired channel), generally undergoes, after amplification in an amplifier stage, for example a low-noise amplifier stage, one or more frequency transpositions in order to convert it into baseband. The incident signal down-converted into baseband is then intended, after filtering, to be converted into digital form in order to subsequently undergo specific processing operations, such as, for example, channel decoding processing notably comprising a demodulation and source decoding processing.

When the frequency transposition is carried out by successively inverting the sign of the incident analog signal at the rhythm of a periodic signal (transposition signal) to control a set of switches, and when the transposed signal is delivered to an output capacitor, belonging to or forming, for example, a filter, this can lead, in particular, to a degradation of the gain of the chain owing to stray capacitances of the amplifier stage causing, at certain moments, a partial discharge of the output capacitor.

SUMMARY OF THE INVENTION

A device and a method are thus proposed that allow the frequency transposition to be improved while at the same time limiting the degradation of the gain.

According to one aspect, a method is for processing an incident signal, in which the incident signal is delivered to a transconductor stage, and a current output of the transconductor stage is connected to an output capacitor so as to deliver to the output capacitor a current signal lasting for at least part of the first half-period of each period of a periodic signal to thus obtain a frequency-transposed signal at the output capacitor. Upon the occurrence of each part of the first half-period, the voltage of the current output, seen from the output capacitor, is reset to a value equal to that of the voltage of the output capacitor.

The device first resets the voltage of the current output. In other words, the voltage of the current output and the voltage of the capacitor are equalized. There may then be no movement of charges (stray current) due to a difference in voltage when the reset current output and the output capacitor are connected, in other words, upon the occurrence of each part of the first half-period of the periodic signal. The gain may not therefore be degraded.

The current output of the transconductor stage is coupled to the output capacitor so as to deliver to the output capacitor a current signal and its opposite, respectively, during the two half-periods of each period of the periodic signal and, upon the occurrence of each half-period of the periodic signal, the voltage of the current output, seen from the output capacitor, may be reset to a value equal to that of the voltage of the output capacitor.

The signal in question here is a current signal. Upon frequency transposition, the frequency transposition device delivers to the output capacitor the current signal and its opposite during each half-period of the transposition signal.

The transconductor stage can comprise two current outputs respectively delivering two current signals of opposing sign. In such an embodiment, upon each first half-period of the periodic signal, the first current output is coupled to the output capacitor and, upon each second half-period of the periodic signal, the second current output is coupled to the output capacitor. In addition, the resetting of the voltage of the first current output comprises the fixing, at least at the end of, and preferably during the whole of each second half-period of the periodic signal, of the voltage of the first current output at the value of the voltage of the output capacitor, and the resetting of the voltage of the second current output comprises the fixing, at least at the end of, and preferably during the whole of each first half-period of the periodic signal, of the voltage of the second current output at the value of the voltage of the output capacitor.

During the first half-period, the voltage of the output capacitor varies at the same time as that of the first current output, as a function of the signal, whereas the voltage of the second current output varies independently as a function of the charges flowing out of it. Thus, a difference between the voltage of the output capacitor and the voltage of the second current output appears during the first half-period, in other words during the half-period in which the second current output is not coupled to the output capacitor.

In order to avoid, when the second half-period occurs, the stray currents due to this difference in voltage, the voltage of the second current output is reset before coupling this second current output to the output capacitor. Here, this resetting includes imposing the voltage of the output capacitor on the second current output. In this way, the voltage difference may be zero, the charges flowing from the second current output may be absorbed, and the stray currents may be avoided.

In other words, preferably, during each half-period of the periodic signal, one current output of the transconductor stage is coupled to the output capacitor, whereas the voltage of the output capacitor is imposed on the other current output of the transconductor stage.

Preferably, the voltage of one of the current outputs is fixed at the value of the voltage of the output capacitor by means of an amplifier stage configured in follower between the output capacitor and the current outputs.

The amplifier stage configured in follower allows the input voltage to be imposed on the output, without modifying the input voltage. In the present case, the input voltage of the amplifier stage is the voltage of the output capacitor and the output voltage of the amplifier stage is the voltage of the current output of the transconductor stage which is not coupled to the output capacitor by the transposition device. Thus, the amplifier stage allows the voltage of the output capacitor to be imposed on the current output that will be connected to the capacitor during the next half-period, without modifying the voltage of the output capacitor, in other words limiting the degradation of the signal. In this way, when the current output is coupled to the output capacitor when the next half-period of the periodic signal occurs, the voltage of the current output and the voltage of the output capacitor may be equal.

According to another embodiment, the transconductor stage comprises a single current output delivering a current signal, in which:

each first half-period of the periodic signal comprises a first part during which the current output is coupled to the output capacitor, and each second half-period of the periodic signal comprises a first part during which the current output is coupled to the output capacitor in the reverse manner to that carried out during the first part of the first half-period of the periodic signal, and in which the resetting of the voltage of the current output comprises:

the fixing of the voltage of the current output at the inverse value to the voltage of the output capacitor at least at the end of the second part of each first half-period of the periodic signal, and the fixing of the voltage of the current output at the value of the voltage of the output capacitor at least at the end of the second part of each second half-period of the periodic signal.

In this embodiment, the coupling between the transposition stage and the output capacitor is reversed upon each half-period of the periodic signal. However, the output of the transconductor stage can exhibit a stray capacitance which is also reversed upon each half-period. Thus, when each half-period occurs, the output capacitor is coupled to the stray capacitance whose voltage is reversed with respect to that of the output capacitor.

In order to then avoid a stray current and hence a degradation of the signal, the voltage opposing that of the output capacitor is imposed on the current output, before the inversion by the frequency-transposition stage. In this way, upon the occurrence of the next half-period, the voltage of the current output seen from the output capacitor is equal to the voltage of the capacitor.

The fixing of the voltage of the current output at the corresponding value is effected, for example, during the whole of the second part of the corresponding half-period of the periodic signal.

Here again, the voltage of the current output is preferably fixed at the value of the voltage of the output capacitor or the inverse of this value by means of an amplifier stage configured in follower between the output capacitor and the current output.

According to another embodiment, the current signal is delivered to the output capacitor, at each first half-period of the periodic signal, and the resetting of the voltage of the current output comprises fixing the voltage of the current output to the value of the voltage of the output capacitor ($C_{IIR}$), at least at the end of the second half-period of the periodic signal.

Preferably, the fixing of the voltage of the current output to the corresponding value is effected during the whole of the second half-period of the periodic signal. Preferably, the voltage of the current output is fixed to the value of the voltage of the output capacitor by means of an amplifier stage mounted as a follower between the output capacitor and the current output.

Whichever embodiment is used, the current output or outputs of the transconductor stage are advantageously, but not necessarily, differential. In one particular application, the incident signal is a radiofrequency signal and the transconductor stage belongs to a low-noise amplifier stage.

In one particular application, the output capacitor forms at least part of an analog filter designed to filter out the frequency components of the transposed signal situated outside of a desired frequency range; the method then also advantageously comprises:

a conversion of the filtered transposed signal into a digital signal, a reformatting of the digital signal into a form substantially similar, at least within the desired frequency range, to the form of the frequency-transposed signal and a final digital filtering of the reformatted digital signal so as to filter out the frequency components situated outside of the desired frequency range.

The desired frequency range is, for example, the bandwidth of the useful signal or the width of the desired frequency channel. The analog filtering, of which the output capacitor forms part, therefore has the aim of filtering, for example, the residues of adjacent channels. In this way, the analog filtering allows on the one hand the dynamic range of the analog/digital converter input to be limited and, on the other, the sampling frequency of the analog/digital converter to be adapted to the bandwidth of the transposed useful signal. The analog/digital conversion is thus improved with respect to the useful signal to be converted.

However, in particular, when the analog filtering is carried out with capacitors referred to as 'memory capacitors', such as the output capacitor, the order of the analog filtering is low, for example less than or equal to 2, and may not allow a satisfactory cutoff of the adjacent channels to be obtained. The analog filtering may also lead to a distortion, within the desired frequency range, of the transposed signal. The consequence of this distortion is a loss of information or a degradation of the useful signal. The reformatting step notably allows the distortion of the signal caused by the analog filtering to be corrected. Thus, despite an analog filtering of low order, for example of order 1, on the one hand the dynamic range of the analog/digital converter can be limited, and on the other, the degradation of the useful signal can be limited.

The reformatting step allows a signal identical, or virtually so, to the transposed signal to be recovered, at least over the desired frequency range before the analog filtering.

The final digital filtering then allows the frequencies situated outside of the desired frequency range to be filtered out. This final filtering is performed digitally and can therefore exhibit an elaborate transfer function that is adapted to the spectrum of the signal to be filtered, without however being too bulky or too costly. It also allows the adjacent channels to be efficiently filtered out without distorting the useful band of the frequency-transposed signal.

The step for filtering the frequency-transposed useful signal is thus transferred to the digital processing part. Indeed, it is easier and less costly to apply an elaborate transfer function with a digital filter than with an analog filter. In addition, thanks notably to the output capacitor, the dynamic range of the analog/digital converter is limited during the conversion of the signal, while at the same time avoiding the loss of information or the degradation of the useful signal.

According to one embodiment, the reformatting is effected within a reformatting digital filter having a working frequency equal to the sampling frequency of the analog/digital conversion and having a transfer function that is the inverse of the transfer function of the analog filtering at least within the desired frequency range.

At the output of the reformatting filter, within the frequency range, a signal is therefore obtained that may be identical to the signal that would have been obtained in the absence of the analog filtering.

The transfer function of the reformatting digital filter may be calculated starting from the transfer function of the analog filtering. This calculation may be simplified by the fact that the working frequency of the digital filter is equal to the sampling frequency.

According to another embodiment, the reformatting is carried out within a reformatting digital filter having a working frequency different from, preferably lower than, the sampling frequency of the analog/digital conversion, and having a transfer function resulting from an approximation of the inverse of the transfer function of the analog filtering, at least within the desired frequency range.

This embodiment relates more particularly to the case where the analog/digital conversion over-samples the analog signal. The over-sampling allows a digital signal to be obtained that is more faithful to the frequency-transposed and filtered analog signal. However, it is not necessary to use the same over-sampling frequency for the digital processing. Thus, it may be helpful to use a working frequency lower than the sampling frequency. In this case, the calculation of the digital equivalent of the transfer function inverse of the analog filtering is made in a different manner and may, in particular, be calculated more easily by approximation within the desired frequency range.

More particularly, the digital reformatting filter has a transfer function, the coefficients of which result from an approximation of the inverse of the transfer function of the analog filtering, at least within the desired frequency range, and the determination of the coefficients may advantageously comprise a selection of reference frequencies chosen within the desired frequency range and, for each of these reference frequencies, a minimization of the difference between the corresponding value of the transfer function inverse of the analog filtering and the corresponding value of the transfer function of the reformatting filter.

In other words, the transfer function of the reformatting filter is calculated in this example by considering a finite number of frequencies chosen within the desired frequency range and for which the difference between the real value of the reformatting filter transfer function and the desired value equal to the inverse of the transfer function of the analog filtering may be minimized. Preferably, the reference frequencies are chosen in a uniform manner within the desired frequency range.

The uniform choice of the reference frequencies may allow a correct approximation of the transfer function inverse of the analog filtering to be obtained by the transfer function of the reformatting filter over the whole width of the desired frequency range.

The order of the analog filtering may be chosen equal to 1 and the approximation of the inverse of the transfer function of the analog filtering may then depend on the order of the digital reformatting filter. In this case, the coefficients of the transfer function of the digital filter are easier to calculate.

The transfer function of the reformatting filter may be, for example, of the finite-impulse-response type.

The transfer function may then be written in a polynomial form of which the coefficients are to be determined. In particular, difference minimization methods may allow the coefficients to be determined for this type of filter.

Preferably, the reformatting and the final digital filtering are carried out within the same filter whose transfer function may be, at least within the desired frequency range, equal to the product of the transfer function of the reformatting filter and the transfer function of the final digital filter.

This embodiment can be applied whether the working frequency of the filter is equal to or different from the sampling frequency. This embodiment allows the reformatting step and the final digital filtering to be carried out at the same time. This avoids the use of a digital signal with a large number of bits between the reformatting filter and the final digital filtering, owing to the reformatting of the signal even outside of the desired frequency range. For this purpose, it suffices to multiply the two transfer functions together so as to obtain only one from them. The signal obtained at the output of the filter remains the same but this results in the fabrication of the device being simplified.

According to another aspect, the invention provides a device for processing an incident signal, comprising:
  a transconductor stage comprising an input for receiving the incident signal,
  an output capacitor,
  frequency-transposition means or circuitry coupled between the transconductor stage and the output capacitor, comprising:
    generation means or circuitry designed to deliver a periodic signal,
    a set of switches configurable in response to a control signal,
    control means or circuitry designed to deliver the control signal starting from the periodic signal for configuring the set of switches in such a manner as to couple a current output of the transconductor stage to the output capacitor and to deliver to the output capacitor a current signal lasting for at least part of the first half-period of each period of the periodic signal and to thus obtain a frequency-transposed signal at the output capacitor.

The device also comprises reset means or circuitry designed to reset, upon the occurrence of each part of the first half-period, the voltage of the current output, seen from the output capacitor, to a value equal to that of the voltage of the output capacitor.

Preferably, the control means or circuitry are capable of delivering the control signal on the basis of the periodic signal in order to configure the set of switches so as to deliver to the output capacitor a current signal and its opposite, respectively, during the two half-periods of each period of the periodic signal and in which the resetting means or circuitry are capable of resetting, upon the occurrence of each half-period of the periodic signal, the voltage of the current output, seen from the output capacitor, to a value equal to that of the voltage of the output capacitor.

According to one embodiment of the device, the transconductor stage comprises two current outputs capable of respectively delivering two current signals of opposing sign. The set of switches has a first state in which it couples the first current output to the output capacitor and a second state in which it couples the second current output to the output capacitor. The control means or circuitry are designed to deliver the control signal in such a manner as to configure the set of switches in the first state during each first half-period of the periodic signal and in the second state during each second half-period of the periodic signal. In addition, the reset means or circuitry are designed to:
  fix the voltage of the first current output at the value of the voltage of the output capacitor at least at the end of each second half-period of the periodic signal,
  fix the voltage of the second current output at the value of the voltage of the output capacitor at least at the end of each first half-period of the periodic signal.

Preferably, the reset means or circuitry comprise an additional set of switches configurable in response to an additional control signal, together with additional control means or circuitry designed to deliver the additional control signal starting from the periodic signal. The additional set of switches has a first state in which it couples the output capacitor to the second current output and a second state in which it couples the output capacitor to the first current output. The additional control means or circuitry are designed to deliver the additional control signal so as to configure the additional set of switches in the first state at least at the end of each first half-period of the periodic signal and in the second state at least at the end of each second half-period of the periodic signal.

The additional control means or circuitry are, for example, designed to deliver the additional control signal so as to configure the additional set of switches in the first state and the second state, respectively, during the whole of the first half-period and the whole of the second half-period of the periodic signal, respectively.

According to another embodiment, the transconductor stage comprises a single current output capable of delivering the current signal. The set of configurable switches has a first state in which it couples the current output to the output capacitor, a second state in which it couples, in a reverse manner to that effected in the first state, the current output to the output capacitor and a third state in which it electrically decouples the current output from the output capacitor. The control means or circuitry are designed to deliver the control signal in such a manner as to configure the set of switches in the first state during the first part of each first half-period of the periodic signal, in the second state during the first part of each second half-period of the periodic signal, and in the third state during the second part of each first half-period and second half-period of the periodic signal. The reset means or circuitry are designed to:

fix the voltage of the current output at the inverse of the value of the voltage of the output capacitor at least at the end of the second part of each first half-period of the periodic signal, fix the voltage of the current output at the value of the voltage of the output capacitor at least at the end of the second part of each second half-period of the periodic signal.

Preferably, the reset means or circuitry comprise an additional set of switches configurable in response to an additional control signal, together with additional control means or circuitry designed to deliver the additional control signal starting from the periodic signal. The additional set of switches has a first state in which it couples the output capacitor to the current output, a second state in which it couples, in a reverse manner to that effected in the first state, the output capacitor to the current output, and a third state in which it electrically decouples the output capacitor from the current output. The additional control means or circuitry are designed to deliver the additional control signal so as to configure the additional set of switches in the first state at least at the end of the second part of each first half-period of the periodic signal, in the second state at least at the end of the second part of each second half-period of the periodic signal, and in the third state during the first part of each first and second half-period of the periodic signal.

The additional control means or circuitry are, for example, designed to deliver the additional control signal in such a manner as to configure the additional set of switches in the first state and the second state, respectively, during the whole of the second part of the first half-period and the second half-period, respectively, of the periodic signal.

According to another embodiment, the transconductor stage comprises a single current output designed to deliver the current signal. The set of configurable switches possesses a first state in which it couples the current output to the output capacitor, and a second state in which it electrically decouples the current output from the output capacitor. The control means or circuitry are designed to deliver the control signal so as to configure the set of switches in the first state during each first half-period of the periodic signal and in the second state during each second half-period of the periodic signal, and the resetting means or circuitry are designed to fix the voltage of the current output to the value of the voltage of the output capacitor at least at the end of the second half-period of the periodic signal.

Preferably, the resetting means or circuitry comprise an additional set of switches configurable in response to an additional control signal and also additional control means or circuitry designed to deliver the additional control signal on the basis of the periodic Signal. The additional set of switches possesses a first state, in which it couples the output capacitor to the current output, and a second state, in which it electrically decouples the output capacitor from the current output. The additional control means or circuitry are designed to deliver the additional control signal so as to configure the additional set of switches in the first state at least at the end of each second half-period of the periodic signal and in the second state during each first half-period of the periodic signal.

Preferably, the reset means or circuitry also comprise an amplifier stage configured in follower between the output capacitor and the current output or outputs by means of the additional set of switches. Preferably, the device has a differential architecture.

In one particular aspect, there is a device in which the output capacitor forms all or part of an analog filter designed to filter the frequency-transposed signal in such a manner as to filter out the frequency components situated outside of a desired frequency range. The device also comprises an analog/digital converter designed to convert the filtered transposed signal into a digital signal, reformatting means or circuitry designed to reformat the digital signal into a form substantially identical to the initial form of the incident signal, at least within the desired frequency range, and additional filtering means or circuitry designed to carry out a final digital filtering of the reformatted digital signal in such a manner as to filter out the frequency components situated outside of the desired frequency range.

According to one embodiment, the reformatting means or circuitry comprise a reformatting digital filter having a working frequency equal to the sampling frequency of the analog/digital converter and having a transfer function inverse of the transfer function of the analog filter, at least within the desired frequency range.

According to another embodiment, the reformatting means or circuitry comprise a reformatting digital filter having a working frequency different from, and preferably lower than, the sampling frequency of the analog/digital converter and having a transfer function resulting from an approximation of the inverse of the transfer function of the analog filter, at least within the desired frequency range.

The digital reformatting filter has, for example, a transfer function, the coefficients of which result from an approximation of the inverse of the transfer function of the analog filtering, at least in the desired frequency range, and the coefficients are, for example, determined such that, for each frequency taken in a group of reference frequencies chosen within the frequency range, the difference between the corresponding value of the transfer function inverse of the analog filter and the corresponding value of the transfer function of the reformatting filter is minimal.

The order of the analog filtering may be chosen to be equal to 1, and the approximation of the inverse of the transfer function of the analog filtering then depends on the order of the digital reformatting filter. The reformatting filter may be of the finite-impulse-response type.

Preferably, the reformatting means or circuitry and the additional digital filtering means or circuitry comprise the same filter whose transfer function is equal to the product of the transfer function of the reformatting filter and the transfer function of the final digital filter. The device may be fabricated in the form of an integrated circuit.

According to another aspect, there is a radiofrequency signal receiver comprising a device for processing a radiofrequency signal such as that previously defined.

BRIEF DESCRIPTION OF THE DRAWINGS

Other advantages and features will become apparent upon examining the detailed description of non-limiting embodiments and their implementations, and of the appended drawings in which:

FIG. 11 shows an example of periodic signal allowing the frequency-transposition stage in FIG. 6 to be configured;

DETAILED DESCRIPTION OF THE PREFERRED EMBODIMENTS

Figure 1:
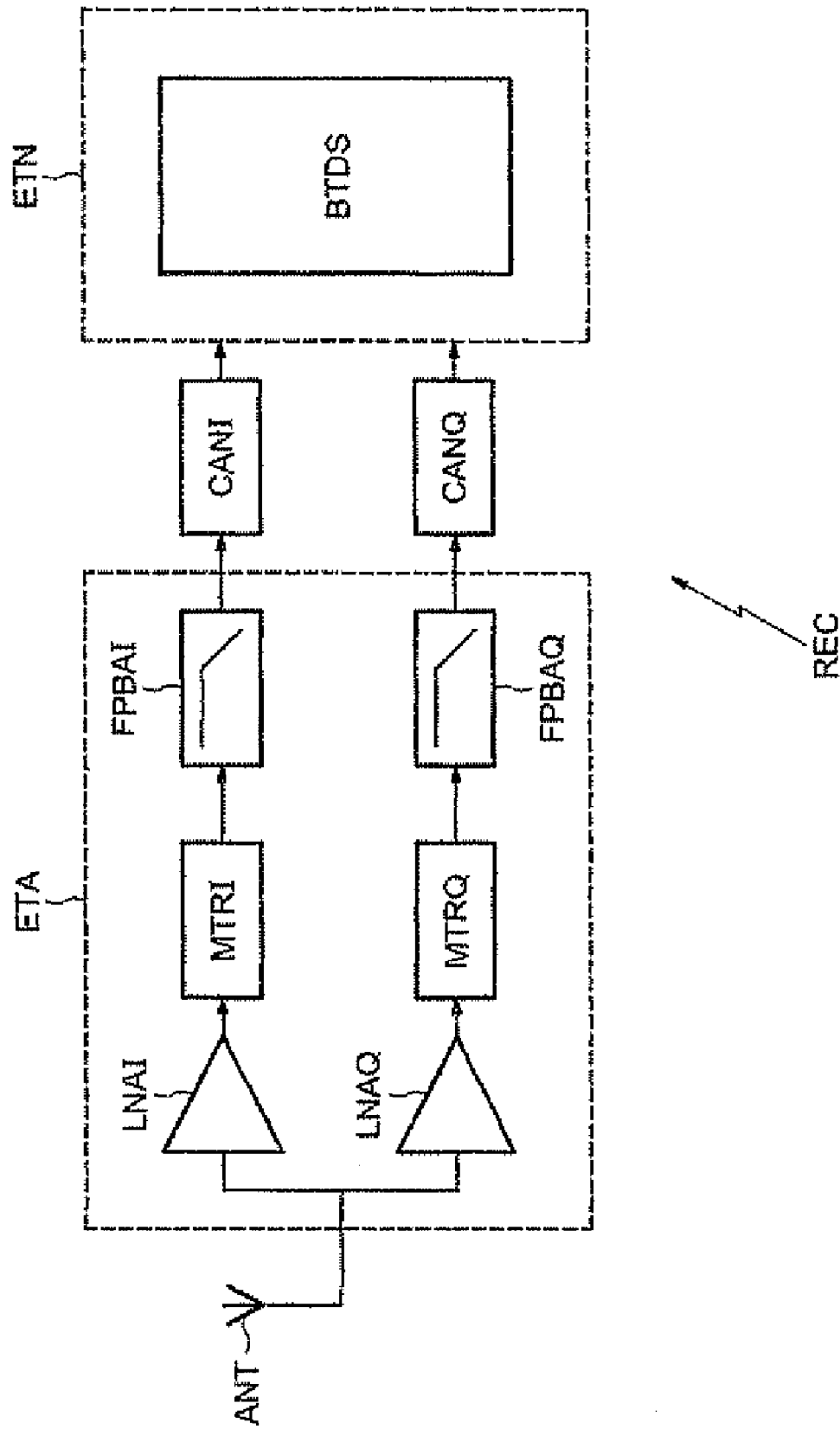
FIG. 1 is a schematic diagram of the internal structure of one embodiment of a device, in accordance with the present invention.

In FIG. 1, the reference REC denotes a receiver of a radiofrequency signal. The receiver REC comprises an antenna ANT picking up the signal, a stage ETA for analog processing of the signal and a stage ETN for digital processing of the signal. The analog processing stage ETA and the digital processing stage ETN are separated by an analog/digital conversion stage CANI and CANQ.

It is considered that the signal picked up by the antenna ANT comprises, for example, several frequency channels each having a central frequency specific to each channel and a width which will be referred to as 'frequency range'.

The analog processing stage ETA comprises at its front end a low-noise amplifier stage LNAI, LNAQ coupled to the antenna ANT. This amplifier stage LNAI, LNAQ is followed by a frequency-transposition stage MTRI, MTRQ. Each frequency-transposition stage MTRI, MTRQ receives the signal coming from the amplifier stage LNAI, LNAQ and here delivers a signal transposed into baseband starting from a transposition signal. The transposition signals are mutually phase-shifted by 90o between the two transposition stages MTRI, MTRQ.

The transposition signal has a frequency equal to the central frequency of the desired channel. As a consequence, the useful signal ends up with a central frequency equal, or about equal, to the zero frequency. In other words, at the output of the two transposition stages MTRI and MTRQ, on the two processing channels I and Q, two analog signals are obtained in quadrature, in baseband, in other words having the useful signal centred around the zero frequency.

In the following part of the text, one of the two processing channels will now be described, for example the channel I, it being clearly understood that the channel Q has an analogous structure.

A low-pass analog filter FPBAI is disposed at the output of the mixer MTRI. The object of the filter FPBAI is to filter out the channels adjacent to the useful signal, in other words the channels situated beyond the frequency range of the desired channel and centred on the zero frequency.

The analog signal at the output of the filter FPBAI is digitized in an analog/digital converter CANI. The digitized signal is then processed in a digital stage ETN of conventional structure and known per se and notably comprising a unit BTDS for processing and demodulating the signal. The unit BTDS also receives a signal from the channel Q and can then carry out the conventional processing of channel decoding, notably demodulation, and source decoding. The unit BTDS can be formed by software means within a microprocessor.

Figure 2:
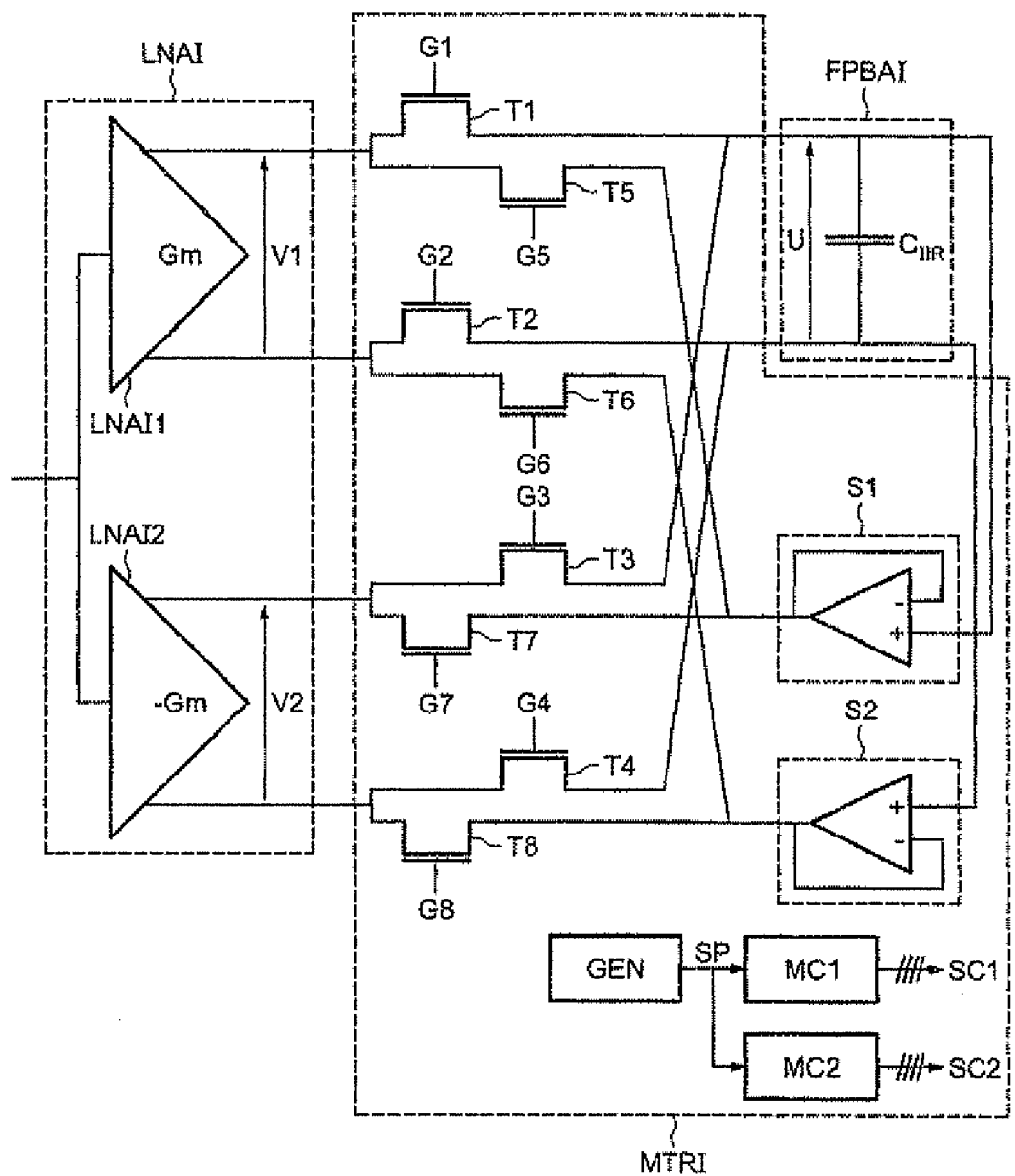
FIG. 2 shows a first embodiment of a frequency-transposition stage, in accordance with the present invention.

FIG. 2 shows a first embodiment of the frequency-transposition stage MTRI, using differential architecture. This embodiment is not limited to a differential architecture, and those skilled in the art will readily be able to adapt the description that follows to a non-differential architecture.

In this first embodiment, the amplifier stage LNAI comprises two output transconductor stages LNAI1 and LNAI2 using differential architecture. The transconductor stage LNAI1 has, for example, a transconductance equal to Gm, and the stage LNAI2 has, for example, a transconductance equal to −Gm. At the two differential current outputs of the amplifier stage LNAI, two current signals of opposing sign are thus obtained.

The current signals of opposing sign are then first transmitted to the frequency-transposition stage MTRI, then to the low-pass filter FPBAI formed, in the present case, by a capacitor known as 'memory capacitor' $C_{IIR}$.

The transposition stage MTRI comprises a signal generator GEN and control means or circuitry MC1. The generator GEN delivers a periodic signal SP (FIG. 5) to the control means or circuitry MC1 which delivers, starting from the periodic signal SP, a control signal SC1.

The control signal SC1 allows a configurable set of switches to be controlled. The set of switches couples, on the one hand, the differential output of the amplifier LNAI1 to the two terminals of the output capacitor $C_{IIR}$ via two transistors T1, T2 and, on the other, the differential output of the amplifier LNAI2 to the two terminals of the output capacitor $C_{IIR}$ via two transistors T3, T4. The transistors T1, T2, T3, T4, for example MOS transistors, are used as switches and are respectively controlled by their gate voltage G1, G2, G3, G4.

The control signal SC1 is generated from the periodic signal SP in such a manner as to alternately couple, at the rhythm of the half-periods of the signal SP, the output of the amplifier LNAI1 and the output of the amplifier LNAI2 to the output capacitor $C_{IIR}$. The signal SC1 here denotes globally, for the sake of simplicity, the control signal of the transistors T1 to T4, it of course being made clear that this signal SC1 in fact includes four elementary signals respectively controlling the gates of the transistors.

The means or circuitry MC1 are, for example, formed from logic gates.

The generator GEN also delivers the periodic signal SP to additional control means or circuitry MC2 which delivers, starting from the periodic signal SP, an additional control signal SC2. The means or circuitry MC2 are also formed from logic gates.

The additional control signal SC2 allows an additional set of switches to be controlled. The additional set of switches couples the two terminals of the capacitor $C_{IIR}$ to the differential output of the amplifier LNAI1 via two transistors T5, T6 and a follower amplifier unit with differential architecture comprising two amplifiers in follower configuration S1, S2. The additional set of switches also couples the two terminals of the output capacitor $C_{IIR}$ to the differential output of the amplifier LNAI2 via two transistors T7, T8 and the two amplifiers S1, S2. The transistors T5, T6, T7, T8 are used as switches and are respectively controlled by their gate voltage G5, G6, G7, G8 using four logic signals globally forming the control signal SC2.

The amplifier unit S1, S2 is configured in follower mode and is therefore capable of imposing its input potential onto its output. The control signal SC2, which controls the gates G5, G6, G7, G8, therefore allows the voltage U of the capacitor $C_{IIR}$ to be imposed onto the output of the amplifier LNAI1 or of the amplifier LNAI2, in other words the value of the voltage U to be imposed as value of the voltage V1 or V2.

Figure 3:
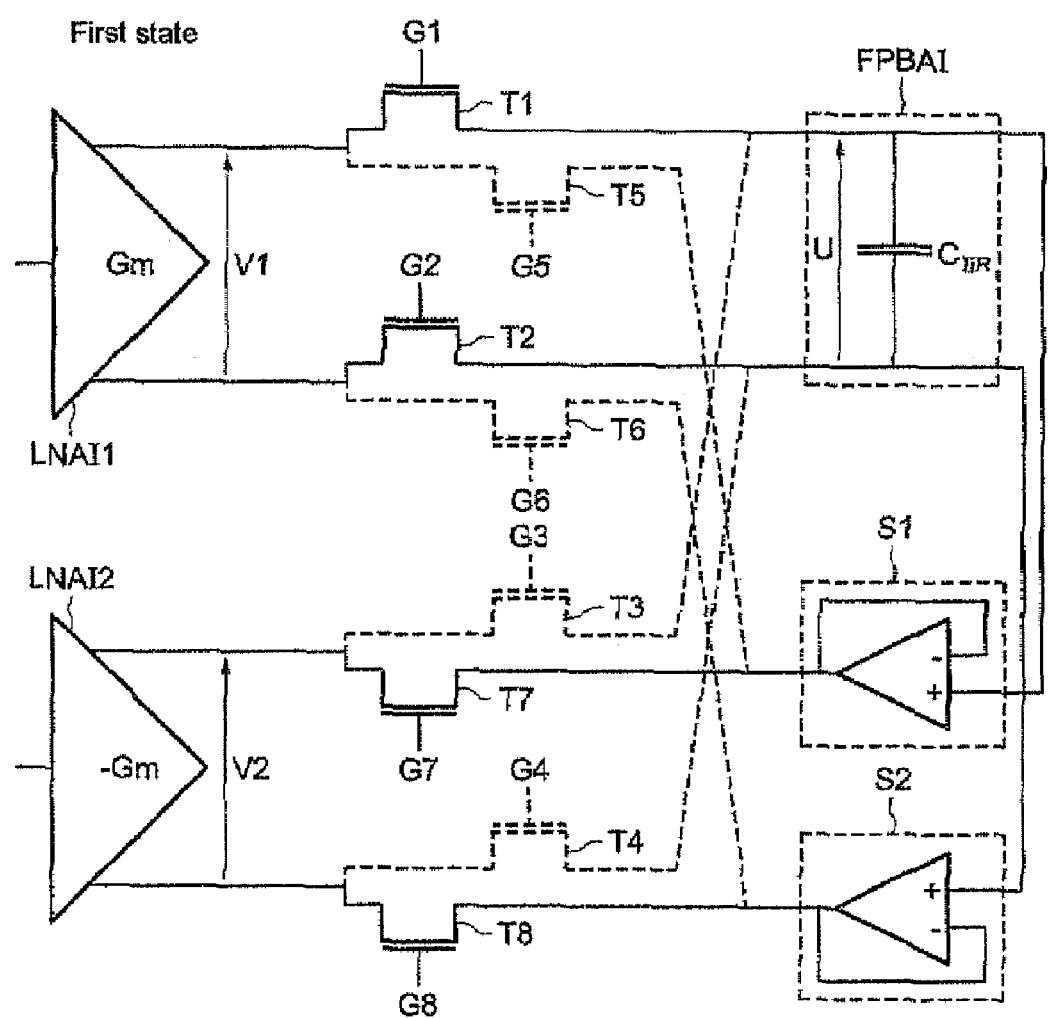
FIGS. 3 and 4 show various configuration states of the transposition stage in FIG. 2.

FIG. 3 shows the first configuration state of the transposition stage MTRI. In this first state, the control means or circuitry MC1 turns off the transistors T3 and T4 via the gate voltages G3, G4, whereas the transistors T1 and T2 are made to conduct. Thus, in the first state, the capacitor $C_{IIR}$ is coupled to the differential output of the amplifier LNAI1, which delivers a current proportional to the incident signal, and the voltage U of the capacitor $C_{IIR}$ is equal to the voltage V1.

In addition, still for the first state, the additional control means or circuitry MC2 turns off the transistors T5 and T6, whereas the transistors T7 and T8 are made to conduct. Thus, the amplifiers in follower configuration S1, S2 can impose the value of the voltage U as value of the voltage V2 of the differential output of the amplifier LNAI2.

Figure 4:
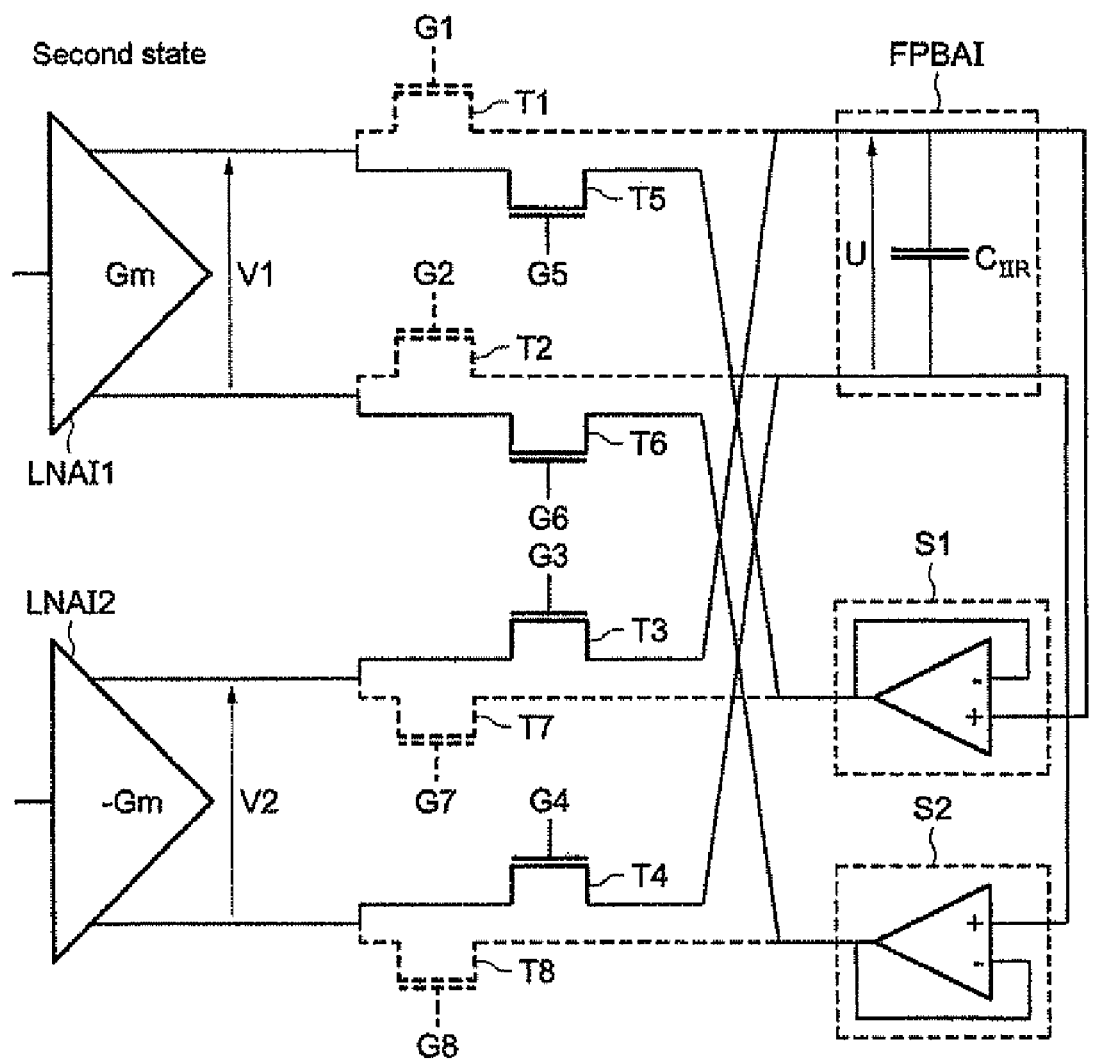

FIG. 4 shows the second configuration state of the transposition stage MTRI. In this second state, the control means or circuitry MC1 turns off the transistors T1 and T2 via the gate voltages G1, G2, whereas the transistors T3 and T4 are made to conduct. Thus, in the second state, the capacitor $C_{IIR}$ is coupled to the differential output of the amplifier LNAI2 which delivers a current proportional to the incident signal and of opposing sign, and the voltage U of the capacitor $C_{IIR}$ is equal to the voltage V2.

In addition, still for the second state, the additional control means or circuitry MC2 turns off the transistors T7 and T8, whereas the transistors T5 and T6 are made to conduct. Thus, the amplifiers in follower configuration S1, S2 can impose the value of the voltage U as value of the voltage V1 of the differential output of the amplifier LNAI1.

Figure 5:
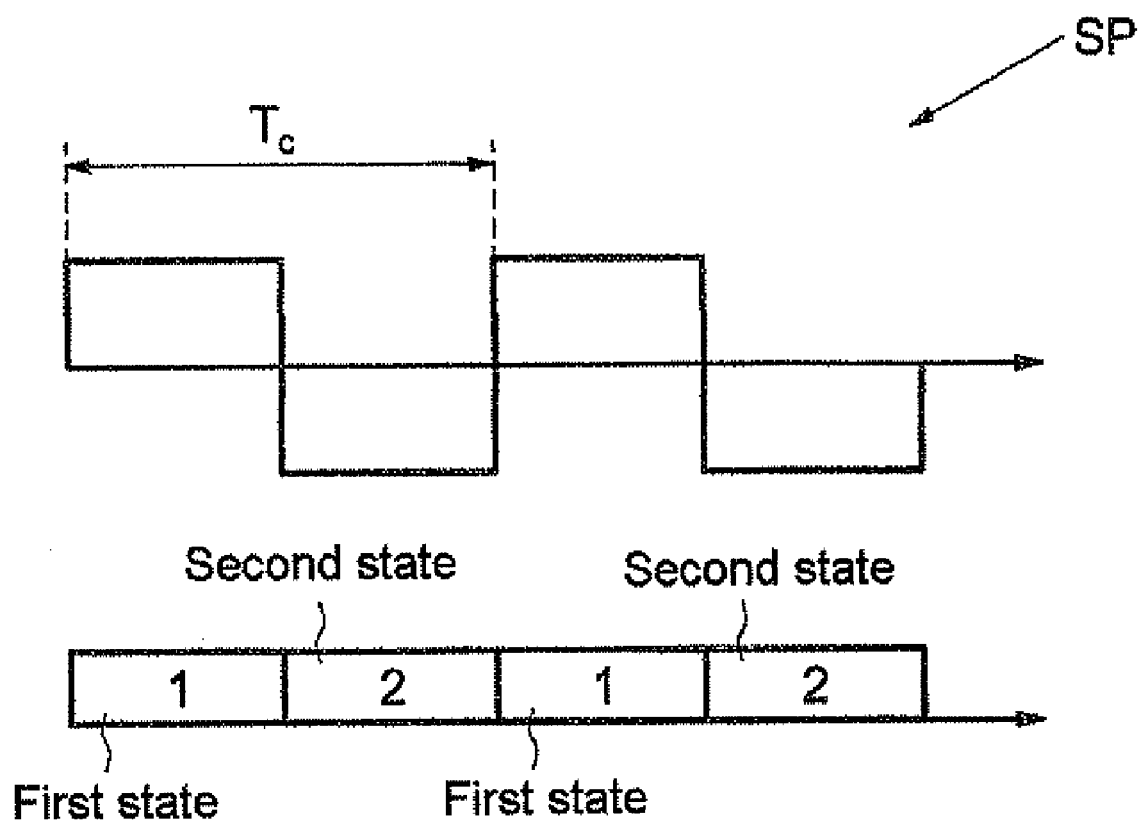
FIG. 5 shows an example of periodic signal allowing the transposition stage in FIG. 2 to be configured.

FIG. 5 shows an example of periodic signal SP delivered by the generator GEN to the control means or circuitry MC1 and to the additional control means or circuitry MC2. The periodic signal SP has a period Tc which corresponds to the transposition frequency, in this case the central frequency of the channel to be processed. During the first half-period of the periodic signal SP, the control means or circuitry MC1 and the additional control means or circuitry MC2 may configure the transposition stage MTRI in the first state, whereas during the second half-period of the periodic signal SP, the control means or circuitry MC1 and the additional control means or circuitry MC2 may configure the transposition stage MTRI in the second state.

Thus, the capacitor $C_{IIR}$ receives a current signal whose sign is reversed every half-period of the periodic signal. The signal across the terminals of the capacitor is therefore a signal transposed in frequency. In addition, in order to avoid stray currents at each change of state of the frequency transposition stage MTRI, the value of the voltage U of the capacitor $C_{IIR}$ is imposed as value of the voltage of the differential output of the amplifier LNAI1 or LNAI2 which may not be coupled to the capacitor $C_{IIR}$.

Figure 6:
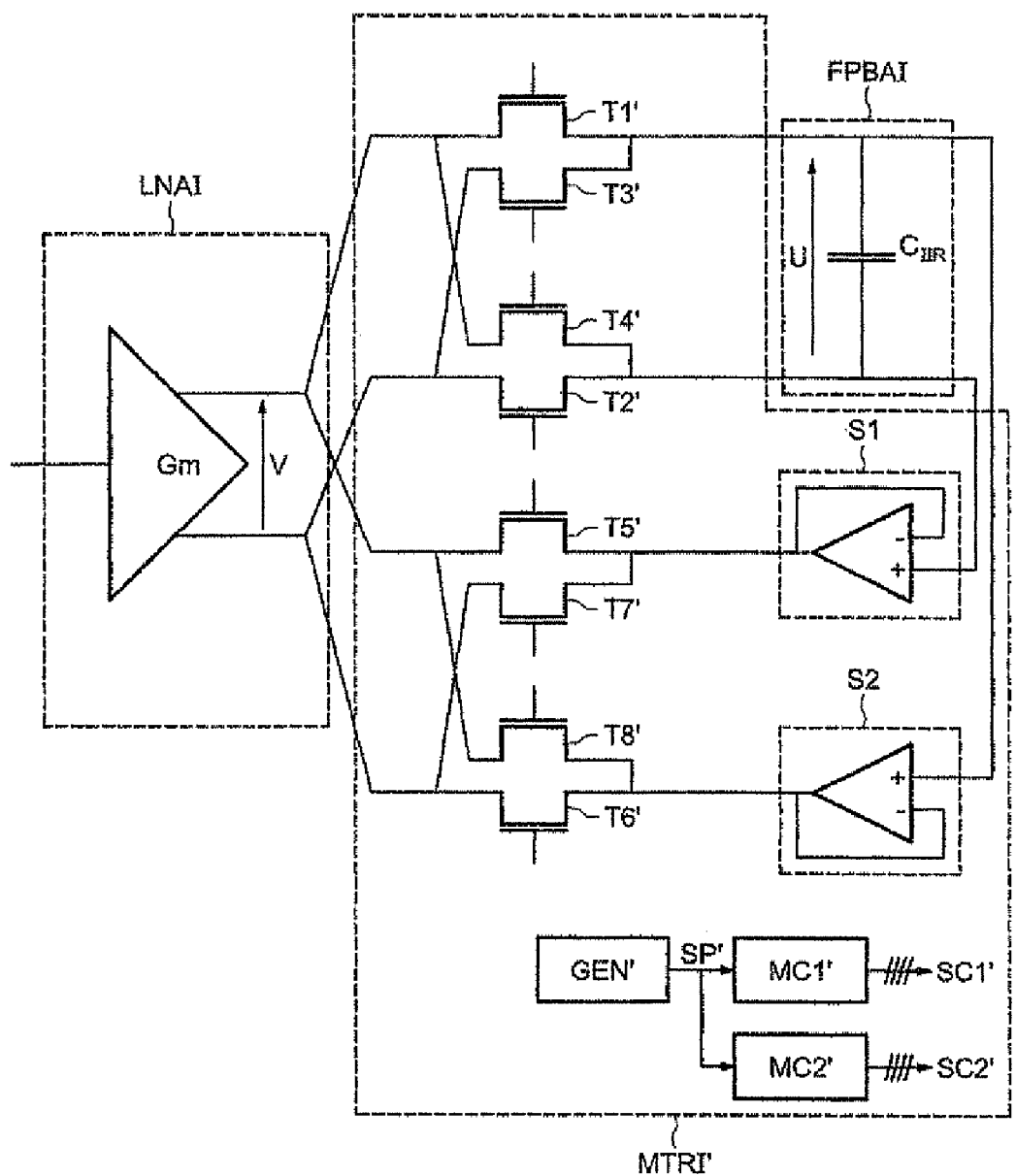
FIG. 6 shows a second embodiment of a frequency-transposition stage, in accordance with the present invention.

FIG. 6 shows a second embodiment of the frequency transposition stage MTRI', using differential architecture. It goes without saying that this second embodiment is not limited to a differential architecture, and those skilled in the art will readily be able to adapt the description that follows to a non-differential architecture.

In this second embodiment, the amplifier stage LNAI comprises a single transconductor stage having, for example, a transconductance equal to Gm and, consequently, a single differential current output.

The current signal is firstly transmitted to the frequency transposition stage MTRI', then to the low-pass filter FPBAI which here is chosen to be identical to the first embodiment.

The transposition stage MTRI' comprises a signal generator GEN' and control means or circuitry MC1'. The generator GEN' delivers a periodic signal SP' (FIG. 11) to the control means or circuitry MC1' which deliver, starting from the periodic signal SP', a control signal SC1'.

The control signal SC1' allows a configurable set of switches to be controlled. The set of switches couples the differential output of the amplifier LNAI to the two terminals of the output capacitor $C_{IIR}$, either directly via two transistors T1', T2', or in a reversed manner via two transistors T3' and T4'. The transistors T1', T2', T3', T4' are used as switches and are controlled by their gate voltage, using four logic signals globally forming the signal SC1'.

The generator GEN' also delivers the periodic signal SP' to additional control means or circuitry MC2' which delivers, starting from the periodic signal SP', an additional control signal SC2'.

The additional control signal SC2' allows an additional configurable set of switches to be controlled. The additional set of switches couples the terminals of the capacitor $C_{IIR}$ to the differential output of the amplifier LNAI via transistors T5', T6', T7', T8', and two amplifiers configured in follower S1, S2. The transistors T5', T6', T7', T8' are used as switches and are controlled by their gate voltage, using four logic signals globally forming the signal SC2'.

In the present case, the differential follower amplifier unit S1, S2 allows the voltage U of the capacitor $C_{IIR}$, or its inverse, to be imposed on the output of the amplifier LNAI, in other words the value of the voltage U, or its inverse (−U), to be imposed as value of the voltage V.

Figure 7:
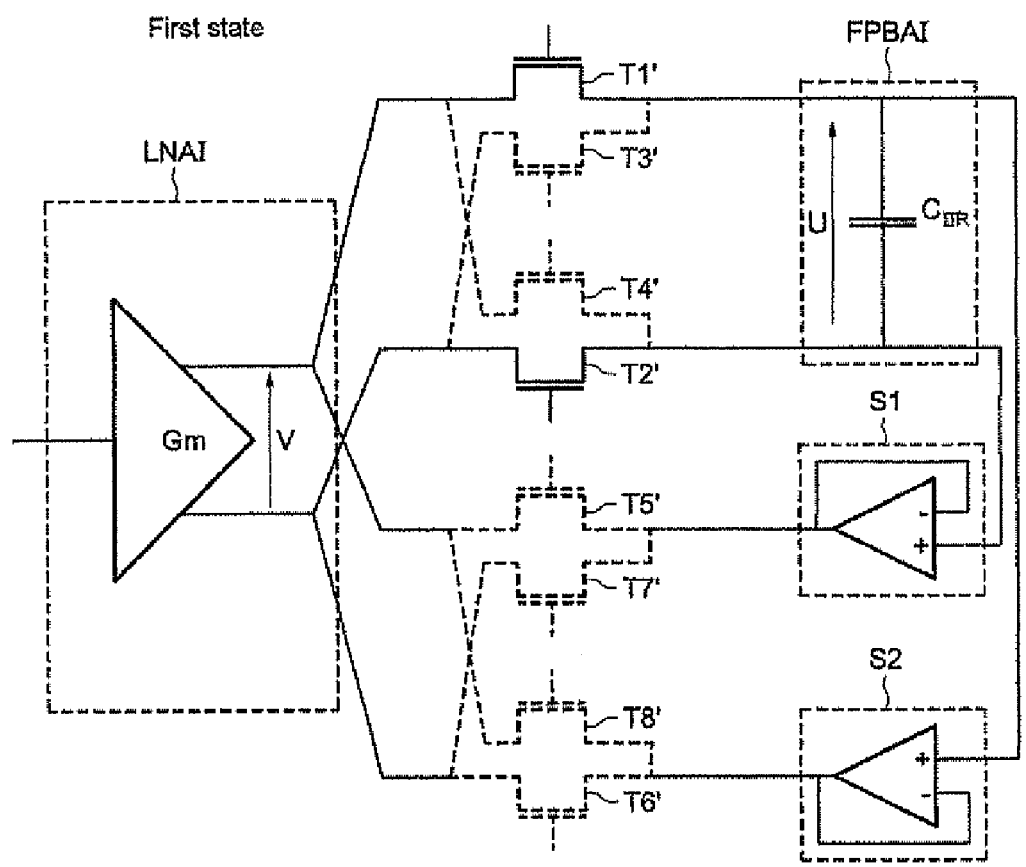
FIGS. 7 to 10 show various configuration states of the transposition stage in FIG. 6.

FIG. 7 shows the first configuration state of the transposition stage MTRI'. In this first state, the control means or circuitry MC1' turn off the transistors T3' and T4', whereas the transistors T1' and T2' are made to conduct. Thus, in the first state, the capacitor $C_{IIR}$ is coupled directly to the differential output of the amplifier LNAI and receives a current proportional to the incident signal. The value of the voltage V of the differential output of the amplifier LNAI is the same as the value of the voltage U of the capacitor $C_{IIR}$.

Furthermore, still for the first state, the additional control means or circuitry MC2' turn off the transistors T5', T6', T7', T8'.

Figure 8:
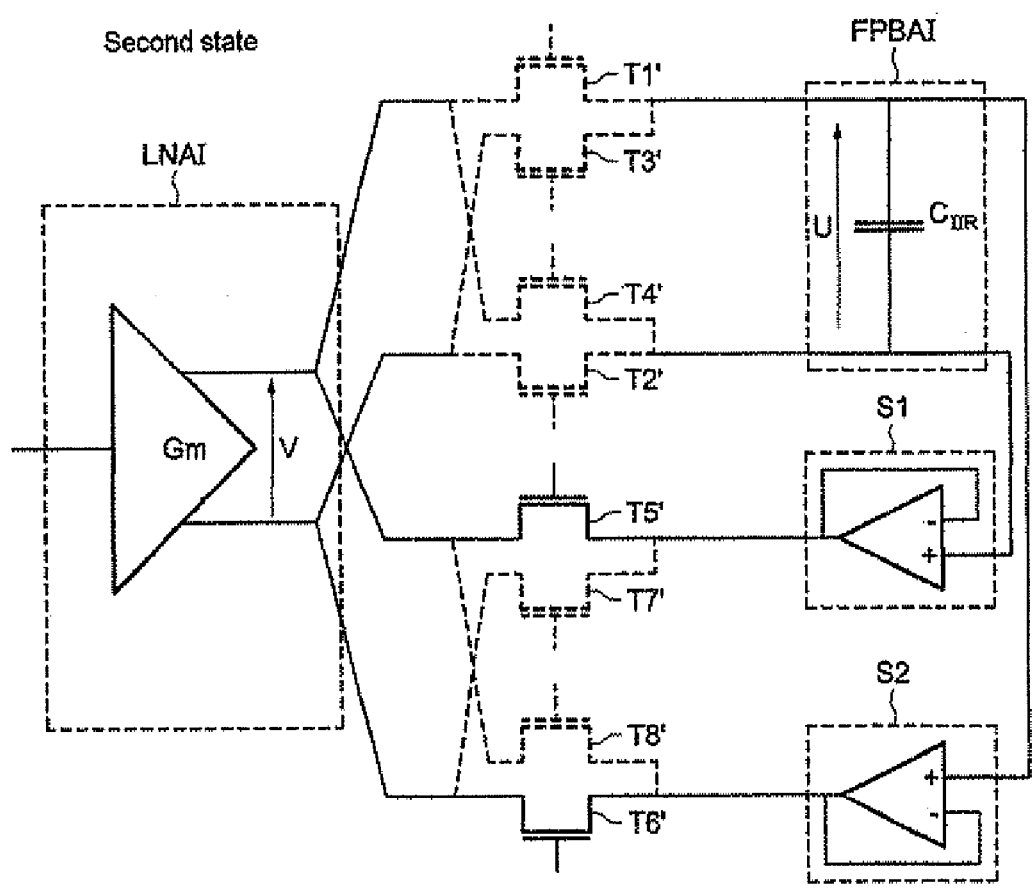

FIG. 8 shows the second configuration state of the transposition stage MTRI'. In this second state, the control means or circuitry MC1' turn off the transistors T1', T2', T3', T4' so that the capacitor $C_{IIR}$ is not electrically coupled to the differential output of the amplifier LNAI. On the other hand, the additional control means or circuitry MC2' make the transistors T5' and T6' conduct, whereas the transistors T7' and T8' are turned off. Thus, the amplifiers in follower configuration S1, S2 can impose the inverse of the value of the voltage U, as value of the voltage V of the differential output of the amplifier LNAI, before the inversion of the connections between the amplifier LNAI and the capacitor $C_{IIR}$.

Figure 9:
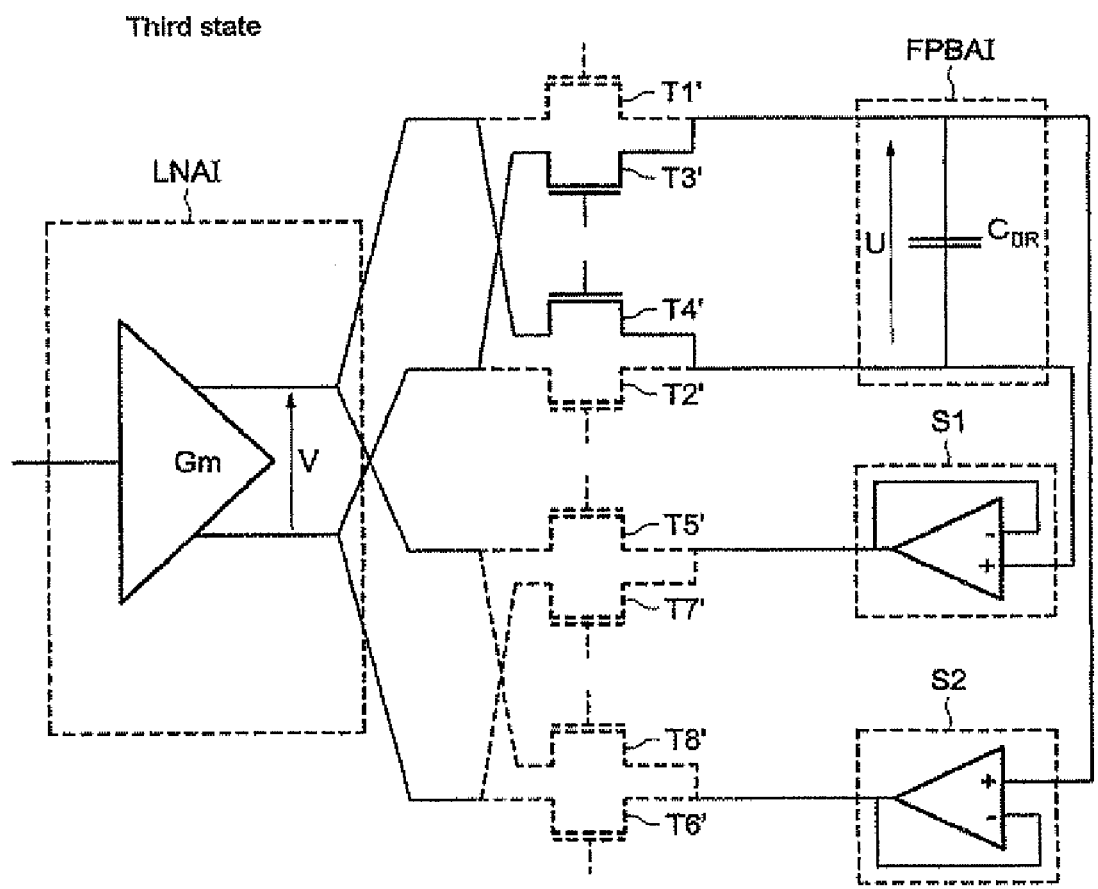

FIG. 9 shows the third configuration state of the transposition stage MTRI'. In this third state, the control means or circuitry MC1' turns off the transistors T1' and T2', whereas the transistors T3' and T4' are made to conduct. Thus, in the third state, the capacitor $C_{IIR}$ is coupled in a reverse manner to the differential output of the amplifier LNAI and receives a current proportional to the incident signal but of opposing sign. The value of the output voltage V of the amplifier LNAI is equal, but of opposing sign, to the voltage U of the capacitor $C_{IIR}$.

In addition, for the third state as for the first state, the additional control means or circuitry MC2' turn off the transistors T5', T6', T7', T8'.

Figure 10:
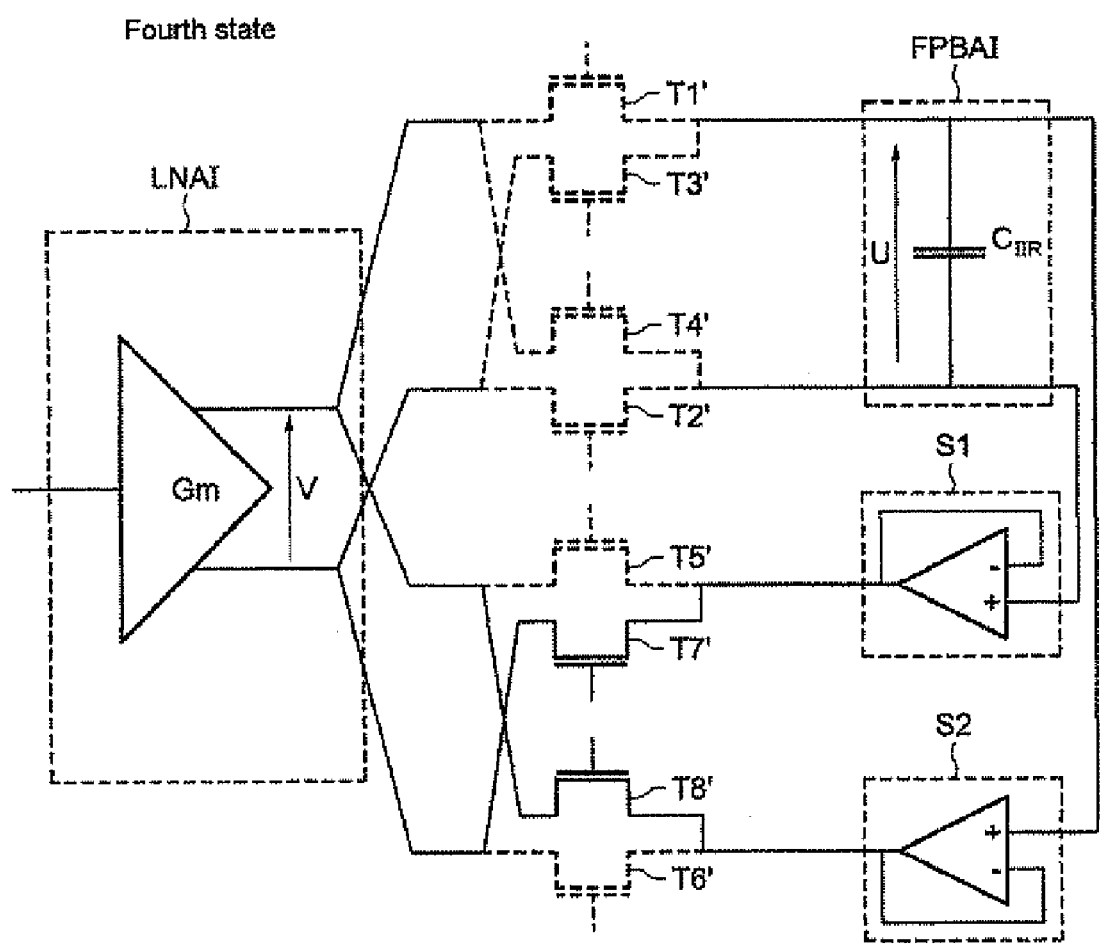

FIG. 10 shows the fourth configuration state of the transposition stage MTRI'. In this fourth state, the control means or circuitry MC1' turn off the transistors T1', T2', T3', T4' so that the capacitor $C_{IIR}$ is not coupled to the differential output of the amplifier LNAI. On the other hand, the additional control means MC2' make the transistors T7' and T8' conduct, whereas the transistors T5' and T6' are turned off. Thus, the amplifiers in follower configuration S1, S2 can impose the value of the voltage U as value of the voltage V of the differential output of the amplifier LNAI, before the inversion of the coupling between the amplifier LNAI and the capacitor $C_{IIR}$.

FIG. 11 shows an example of periodic signal SP' delivered by the generator GEN' to the control means or circuitry MC1' and to the additional control means or circuitry MC2'. The periodic signal SP' has a period Tc which corresponds to the transposition frequency, in this case the central frequency of the channel to be processed.

During the first half-period of the periodic signal SP', the control means or circuitry MC1' and the additional control means or circuitry MC2' will configure the transposition stage MTRI' in the first state and the second state, whereas during the second half-period of the periodic signal SP', the control means or circuitry MC1' and the additional control means or circuitry MC2' will configure the transposition stage MTRI' in the third state and the fourth state.

During a first part P1 of the first half-period, using the control means or circuitry MC1' and the additional control means or circuitry MC2', the signal SP' configures the transposition stage in the first state. During this first state, the amplifier stage LNAI delivers to the capacitor $C_{IIR}$ a current signal proportional, and non-inverted, to the incident signal. The output voltage V of the amplifier LNAI has the same value as the voltage U of the capacitor $C_{IIR}$.

Then, during the second part P2 of the first half-period, the periodic signal SP' configures the transposition stage in the second state until the end of the first half-period. In the second state, the differential output of the amplifier stage LNAI is no longer coupled to the capacitor $C_{IIR}$, but the inverse value of the voltage U of the capacitor $C_{IIR}$ is imposed as value of the voltage V of the differential output of the amplifier LNAI. The value of the voltage V may therefore equal to (−U).

During a first part P1 of the second half-period of the periodic signal SP', the transposition stage is configured in the third state in which the differential outputs of the amplifier stage LNAI are coupled to the capacitor $C_{IIR}$ in a reversed manner. At the start of the second half-period, the voltage U of the capacitor may therefore be equal to the inverse (−V) of the differential output voltage of the amplifier LNAI seen from the capacitor. During this third state, the amplifier stage LNAI delivers to the capacitor $C_{IIR}$ a current signal proportional and inverse to the incident signal. The output voltage V of the amplifier LNAI may have the same value as the inverse (−U) of the voltage of the capacitor $C_{IIR}$.

Then, during the second part P2 of the second half-period, the periodic signal SP' configures the transposition stage in the fourth state until the end of the second half-period. In the fourth state, the differential output of the amplifier stage LNAI is no longer coupled to the capacitor $C_{IIR}$, but the value of the voltage U of the capacitor $C_{IIR}$ is imposed as value of the voltage V of the differential output of the amplifier LNAI. The value of the voltage V is therefore equal to the voltage U of the capacitor $C_{IIR}$.

Thus, the capacitor $C_{IIR}$ receives, during a part P1 of each half-period, a current signal whose sign is reversed every half-period of the periodic signal. The signal across the terminals of the capacitor $C_{IIR}$ is therefore a signal transposed in frequency. In addition, in order to avoid stray currents at each half-period of the periodic signal SP', the value of the voltage U, or its inverse (−U), is imposed as value of the voltage V of the differential output of the amplifier LNAI during a part P2 of the second part of each half-period.

Finally, the first part P1 of the first half-period and the first part P1 of the second half-period could be chosen so as to have an equal or a different duration. The same is true for the second part P2 of each of the half-periods. In addition, the relative duration of the first part 21 and the second part 22 of the same half-period may be adapted according to the case, in such a manner as to allow an optimum operation of this first embodiment.

Figure 12:
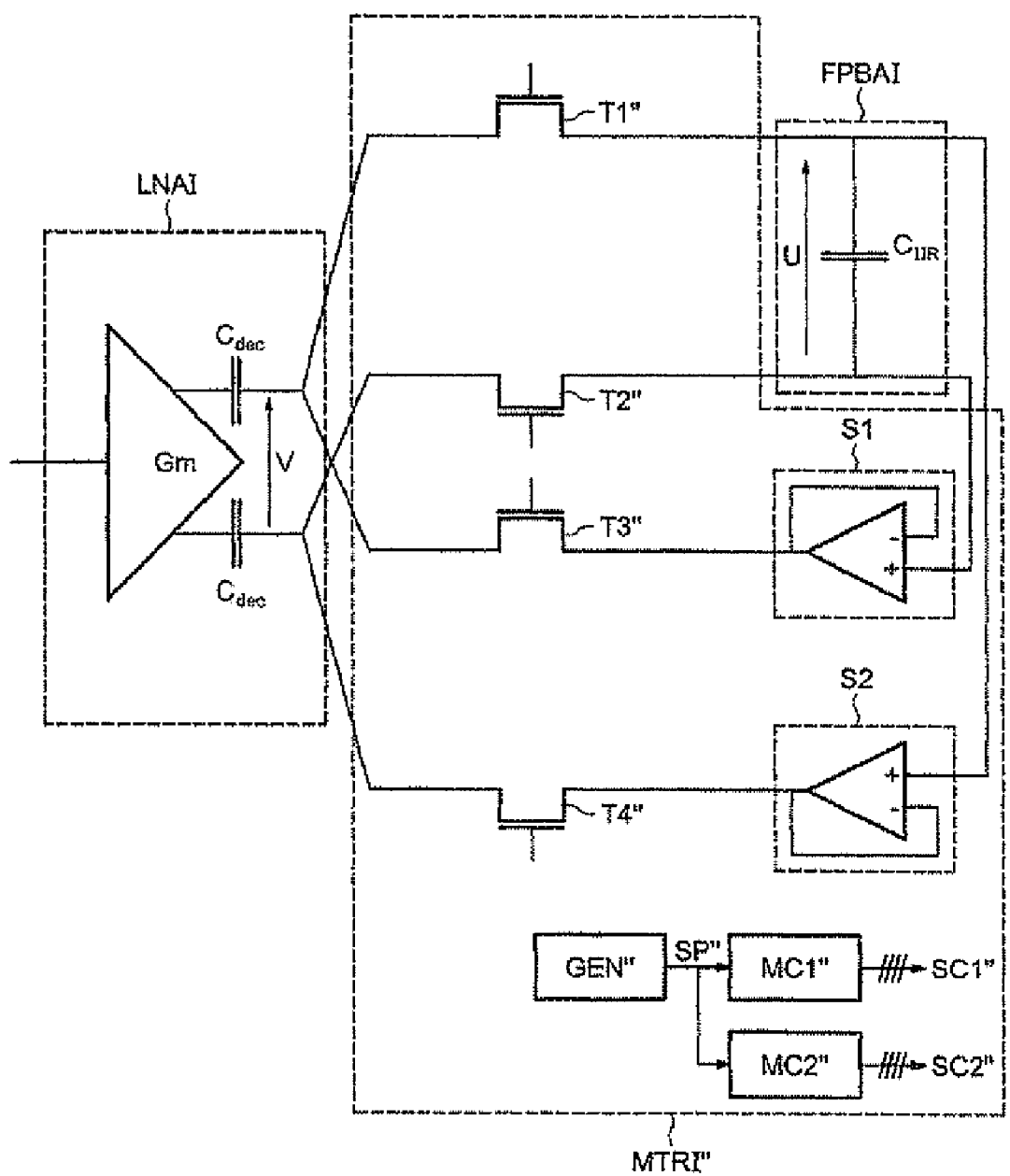
FIG. 12 shows a third embodiment of a frequency-transposition stage, in accordance with the present invention.

FIG. 12 shows a third embodiment of the frequency transposition stage MTRI" in differential architecture. It goes without saying that this third embodiment is not limited to a differential architecture, and a person skilled in the art will readily know how to adapt the following description to a non-differential architecture.

In this embodiment, the low-pass filter FPBAI is chosen so as to be the same as in the second embodiment. The amplifier stage LNAI comprises a single transconductor stage having, for example, a transconductance equal to Gm, and consequently a single differential current output. However, in this embodiment, the transposition stage MTRI" may not allow the DC component of the current coming from the amplifier stage LNAI to be entirely transposed. Thus, to avoid superimposing the transposed signal with part of the DC component of the signal coming from the amplifier stage LNAI, the latter comprises the decoupling capacitors $C_{dec}$ coupled in series on a differential output and capable of filtering the low frequencies of the signal coming from the LNAI. In particular, the value of the decoupling capacitors $C_{dec}$ may be chosen according to the output resistance of the amplifier stage LNAI so as to obtain a high-pass filter capable of filtering the DC component and the low-frequency component of the signal coming from the amplifier stage LNAI, and capable of barely modifying the working signal to be transposed by the transposition stage MTRI".

The current signal is therefore filtered by the decoupling capacitor $C_{dec}$ and is transmitted to the frequency transposition stage MTRI" and then to the low-pass filter FPBAI.

The transposition stage MTRI" comprises a signal generator GEN" and control means MCI". The generator GEN" delivers a periodic signal SP" (FIG. 15) to the control means or circuitry MCI" which delivers a control signal SCI" on the basis of the periodic signal SP".

The control signal SCI" makes it possible to control a set of configurable switches. The set of switches couples the differential output of the amplifier LNAI to the two terminals of the output capacitor $C_{IIR}$ directly via two transistors T1" and T2". The transistors T1" and T2" are used as switches and are controlled by their gate voltage on the basis of two logic signals forming overall the signal SC1".

The generator GEN" also delivers the periodic signal SP" to additional control means or circuitry MC2" which deliver, on the basis of the periodic signal SP", an additional control signal SC2".

The additional control signal SC2" makes it possible to control an additional set of configurable switches. The additional set of switches couples the terminals of the capacitor $C_{IIR}$ to the differential output of the amplifier LNAI via transistors T3", T4" and two amplifiers coupled as followers S1, S2. The transistors T3", T4" are used as switches and may be controlled by their gate voltage on the basis of two logic signals forming overall the signal SC2".

In the present case, the follower differential amplifier block S1, S2 makes it possible to impose the voltage U of the capacitor $C_{IIR}$ at the output of the amplifier LNAI, that is to say to impose the value of the voltage U as value of the voltage V.

Figure 13:
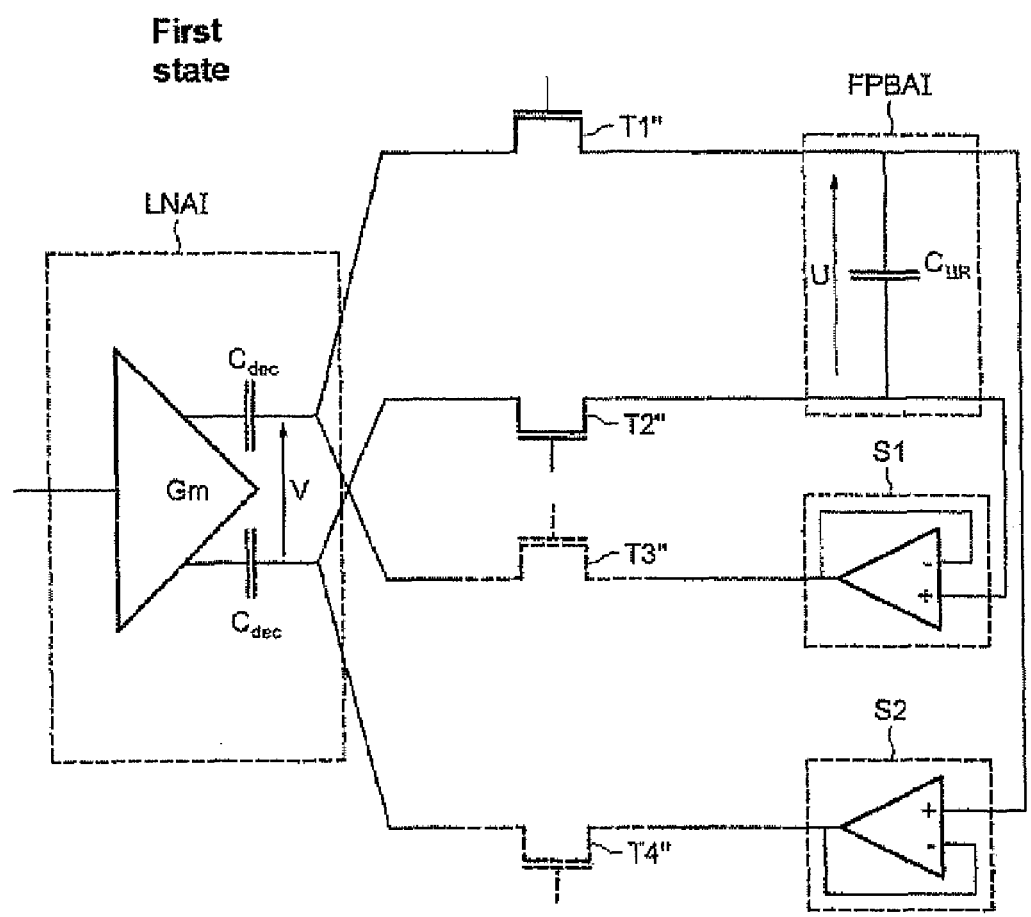
FIGS. 13 and 14 show various configuration states of the transposition stage of FIG. 12.

FIG. 13 shows the first configuration state of the transposition stage MTRI". In this first state, the additional control means or circuitry MC2" turn off the transistors T3" and T4", whereas the control means or circuitry MCI" turn on the transistors T1' and T2". Thus, in the first stage, the capacitor $C_{IIR}$ is coupled directly to the differential output of the amplifier LNAI and receives a current proportional to the incident signal and filtered by the decoupling capacitors $C_{dec}$. The value of the voltage V of the differential output of the amplifier LNAI may be the same as the value of the voltage U of the capacitor $C_{IIR}$.

Figure 14:
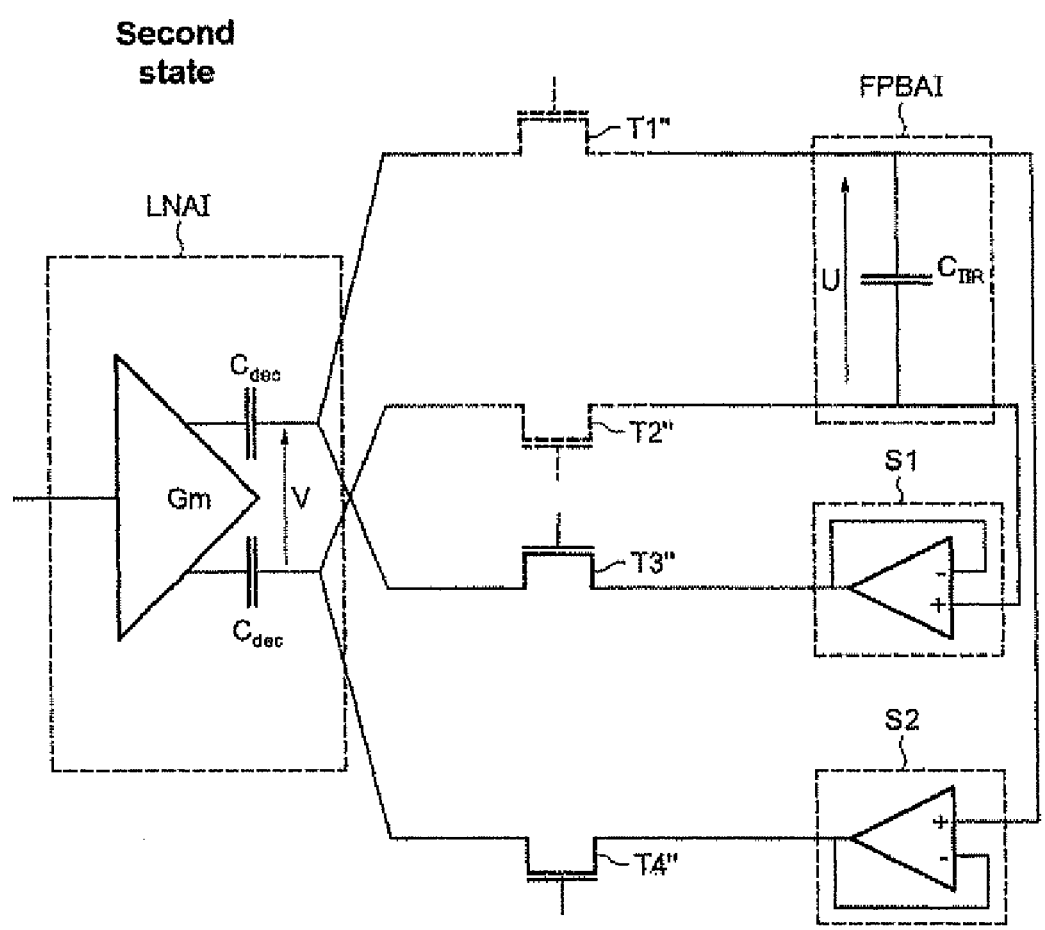

FIG. 14 shows the second configuration state of the transposition stage MTRI1". In this second state, the control means or circuitry MCI" turn off the transistors T1", T2" so that the capacitor $C_{IIR}$ is not electrically coupled to the differential output of the amplifier LNAI. However, the additional control means or circuitry MC2" turn on the transistors T3" and T4". Thus, the amplifiers S1, S2 coupled in follower mode may impose the value of the voltage U as value of the voltage V of the differential output of the amplifier LNAI before the amplifier LNAI is coupled to the capacitor $C_{IIR}$.

Figure 15:
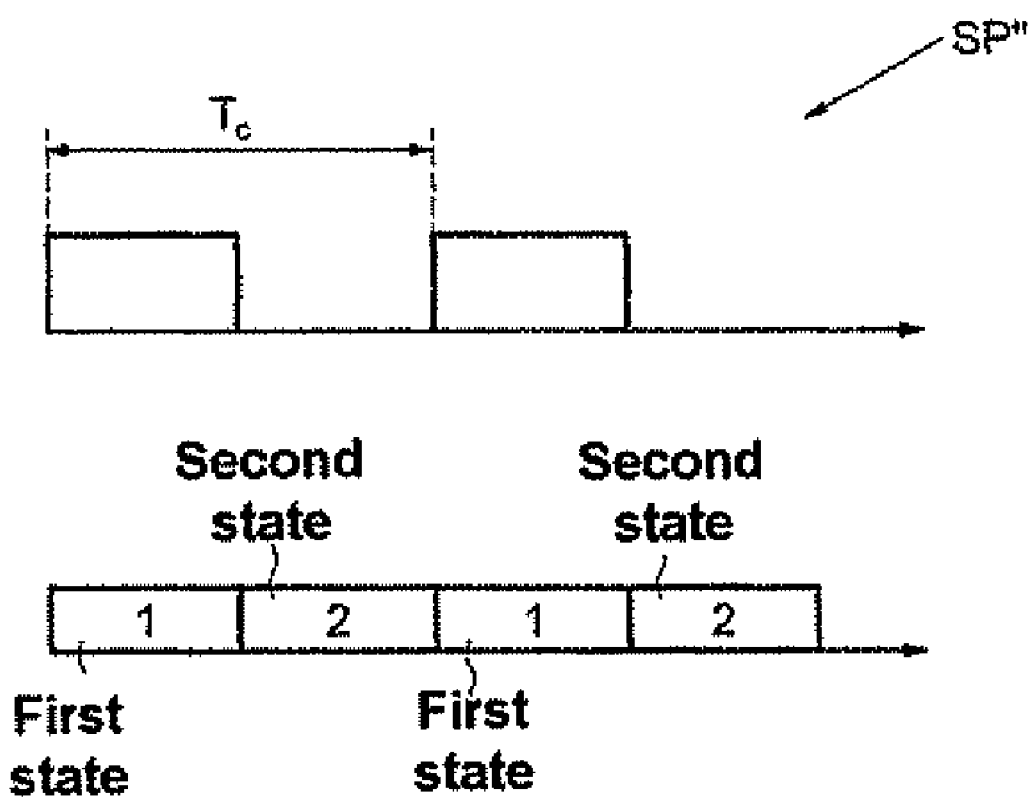
FIG. 15 shows an example of a periodic signal allowing the transposition stage of FIG. 12 to be configured.

FIG. 15 shows an example of a periodic signal SP" delivered by the generator GEN" to the control means or circuitry MCI" and to the additional control means or circuitry MC2". The periodic signal SP" has a period $T_c$ that corresponds to the transposition frequency, in this case the central frequency of the channel to be processed.

During the first half-period of the periodic signal SP", the control means or circuitry MCI" and the additional control means or circuitry MC2" may configure the transposition stage MTRI" in the first state, whereas during the second half-period of the periodic signal SP" the control means or circuitry MC1" and the additional control means or circuitry MC2" may configure the transposition stage MTRI" in the second state.

The capacitor $C_{IIR}$ thus receives a current signal during the first half-period of the periodic signal. The signal at the terminals of the capacitor is therefore a frequency-transposed signal. In addition, to avoid stray currents at each start of a first-period, the value of the voltage U of the capacitor $C_{IIR}$ is imposed as value of the voltage of the differential output of the amplifier LNAI before the start of each first half-period.

Figure 16:
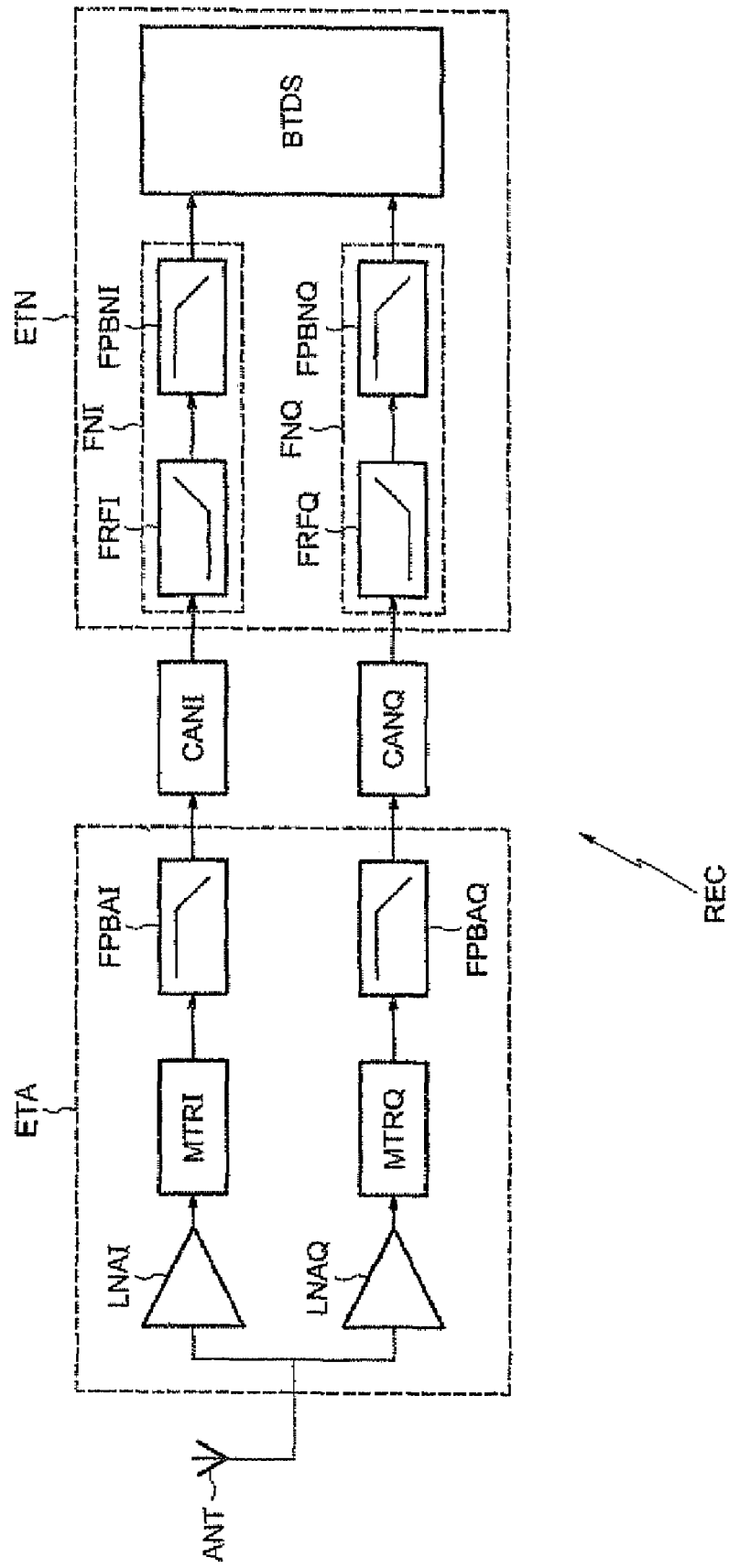
FIGS. 16 to 20 illustrate schematically other embodiments and their implementations, in accordance with the present invention.

Reference is now more particularly made to FIG. 16 and the following figures in order to illustrate another embodiment which allows, in combination with that illustrated in FIGS. 1 to 15, the performance of the receiver chain to be further improved. In this example, the filter FPBAI is an analog filter of low-order filtering. In the particular case of a first-order low-pass filter and with cutoff frequency $f_0$, this means that a signal at a frequency equal to $10.f_0$ may be attenuated by 20 dB. If a higher attenuation is desired at the frequency $10.f_0$, either a higher-order filter is chosen (a filter of order 2 may give an attenuation of 40 dB at $10.f_0$), or a cutoff frequency $f'_0$ lower than $f_0$ is chosen (since the attenuation increases between $10.f'_0$ and $10.f_0$).

Since the order of the filter is fixed for reasons of cost, size and fabrication, an efficient filtering out of the adjacent channels is achieved by choosing a cutoff frequency situated within the desired frequency range, in other words within the desired channel. The consequence of this may, however, be to also filter out the useful signal. Thus, for the frequencies of the desired frequency range that are higher than the cutoff frequency, the attenuation is at least 3 dB (which corresponds to the attenuation at the cutoff frequency). The filter FPBAI therefore distorts a part of the signal.

On the other hand, the adjacent channels are filtered out despite the low order of the filter FPBAI. Thus, the analog/digital conversion of the signal obtained at the output of the filter FPBAI may require a narrower dynamic range, in other words a smaller number of bits.

Ideally, the sampling allows the entirety of the information to be conserved when the sampling frequency is equal to at least twice the highest frequency in the signal to be sampled. Thanks to the cutoff frequency of the filter FPBAI intentionally chosen to be low, the sampling frequency may also be able to be chosen low. Moreover, since the analog filtering was significant, the amount of information in the filtered signal, including outside of the useful signal, is reduced. The signal can then be digitized with a smaller number of bits.

The internal structure of the digital processing stage ETN used in this embodiment will now be described in more detail.

The stage ETN comprises a reformatting filter FRFI. The filter FRFI is a digital filter, for example a finite-impulse-response filter whose transfer function is chosen equal to or substantially similar to the inverse of the transfer function of the filter FPBAI over at least the desired frequency range, in other words within the channel of the desired signal.

This filter FRFI allows the incident signal to be reconstructed both within and outside of the desired frequency range. At the output of the filter FRFI, a signal close to the signal output from the mixer MTRI is therefore found. A digital filtering, for example a low-pass or bandpass filtering, is then once again carried out in order that the adjacent channels reformatted by the filter FRFI are once more filtered out.

The digital processing stage ETN thus comprises a digital filter FPBNI allowing the adjacent channels to be filtered out. However, the digital filter FPBNI can now be of a high order since it is easier, less bulky, and less costly to fabricate a digital filter of high order than an analog filter of high order.

It is therefore possible to fabricate a filter FPBNI capable of filtering out the adjacent channels with little or no distortion of the useful signal.

Thus, thanks to the device such as that described, it is possible to achieve the filtering of the useful signal with a digital filter without however using for this an analog-digital converter with a wide dynamic range.

The filter FRFI and the filter FPBNI can be formed within one and the same digital filter FNI. For this purpose, it suffices to multiply the respective transfer functions of the two filters FRFI and FPBNI and to digitally form the resulting filter FNI. The fabrication of one and the same filter performing both the reformatting and the high-order low-pass filtering allows the fabrication of the device to be simplified and the useful signal obtained to be improved.

The final signal obtained on the channel I is then sent to the unit BTDS.

Figure 17:
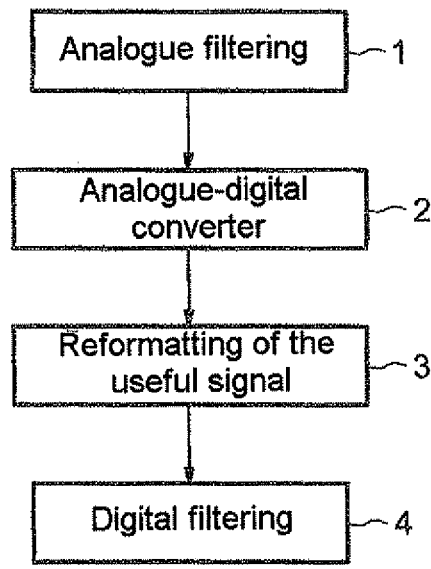

FIG. 17 shows a diagram on which the various steps of one implementation of the method, corresponding to the architecture in FIG. 16, are indicated. Thus, a first step 1 is provided during which an analog filtering of the frequency-transposed incident signal is performed. The analog filtering here is intentionally chosen to be low, in other words at least a part of the useful signal is also filtered, in order to limit the bandwidth of the filtered signal. The analog filtering can be easily achieved for example by the capacitor $C_{IIR}$ referred to as 'memory capacitor' which exhibits a low-order of filtering.

In a second step 2, the analog signal is converted into a digital signal. Thanks to the analog filtering, the digital signal uses a smaller number of bits.

In a third step 3, the digital signal is reformatted in order to compensate for the distortion of the frequency-transposed useful signal. This re-conditioning can be carried out notably by using a filter whose transfer function is equal to the inverse of that of the analog filtering.

Once the digital signal has been reformatted, the adjacent channels are once more filtered out since they have also been reformatted during the third step 3. Thus, the fourth step 4 comprises a digital filtering of the reformatted signal in order to only conserve the useful signal. In particular, the final digital filtering can be carried out with a much higher order than the analog filtering, which allows the adjacent channels to be filtered out without distortion of the useful signal.

The third step 3 will now be described in more detail.

In a first embodiment, it is considered that the reformatting filter FRFI is timed at a working frequency equal to the sampling frequency of the analog/digital converter CANI. The filter FRFI then has a transfer function equal to the inverse of the transfer function of the filter FPBAI. For example, the filter FPBAI is a filter of order 1 whose digital equivalent transfer function F may be written in the form:

$$F(f) = \frac{1-\beta}{1-\beta e^{-2i\pi \frac{f}{F_s}}}$$

where $\beta$ is an integer and $F_S$ is the sampling frequency.

The filter FRFI is then chosen so as to exhibit a transfer function H equal to:

$$H(f) = F^{-1}(f) = \frac{1-\beta e^{-2i\pi \frac{f}{F_s}}}{1-\beta}$$

Those skilled in the art will readily be able to generate this transfer function H digitally.

In a second embodiment, the case is considered where the filter FRFI is timed at a working frequency $F_S/N_{div}$, different from the sampling frequency $F_S$ of the analog/digital converter CANI. The function H can no longer be determined as previously and the transfer function of the reformatting filter FRFI is then an approximation $H_{approx}$ of the inverse H of the transfer function of the filter FPBAI. This approximation $H_{approx}$ is the closest to the function H within the bandwidth of the signal that it is desired to reformat.

Figure 18:
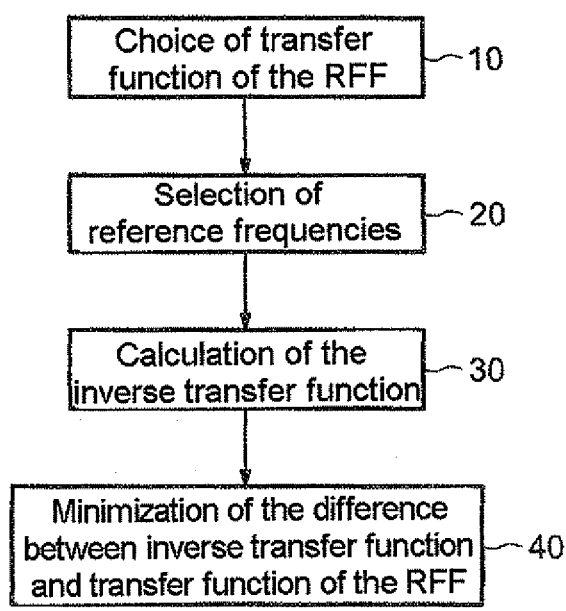

FIG. 18 shows a diagram for determining a transfer function approximating the function H. The case is considered in which the filter FRFI is a finite-impulse-response filter of order $N_{fir}$. The transfer function $H_{approx}$ of the filter FRFI can then be written in the form:

$$H_{approx} = \alpha_0 + \alpha_1 e^{2i\pi \frac{f}{NdivF_s}} + \alpha_2 e^{2i\pi \frac{2f}{NdivF_s}} + \ldots + \alpha_{Nfir-1} e^{2i\pi \frac{|Nfir-1|f}{NdivF_s}}$$

The determination of the approximate transfer function $H_{approx}$ comprises the determination of the coefficients $[\alpha_0; \alpha_1; \ldots; \alpha_{Nfir-1}]$, and minimizing the difference between the transfer function H and the function $H_{approx}$ over the bandwidth of the useful signal.

In a first step 10, the form of the transfer function $H_{approx}$, and more particularly the order of the transfer function $H_{approx}$ which provides the number of coefficients $[\alpha_0; \alpha_1; \ldots; \alpha_{Nfir-1}]$ to be determined, is chosen.

In a second step 20, a finite number of reference frequencies $f_1, f_2, \ldots, f_{Nfrq}$ is chosen for which the difference between the two transfer functions H and $H_{approx}$ may be minimized. The choice of these frequencies and their number will directly determine the precision of the approximation, together with the complexity of the calculation of $H_{approx}$. Thus, reference frequencies are preferably chosen that are uniformly distributed within the desired frequency range.

A vector $F_{ref}$ is then constructed whose coordinates are the previously-determined reference frequencies; subsequently, in a third step 30, the vector $H_{ref}$ is calculated whose coordinates are the values of the transfer function H for each of the reference frequencies.

Therefore:

$$F_{ref} = \begin{bmatrix} f_1 \\ f_2 \\ \ldots \\ f_{Nfrq} \end{bmatrix}$$

and:

$$H_{ref} = H(F_{ref}) = H\left(\begin{bmatrix} f_1 \\ f_2 \\ \ldots \\ f_{Nfrq} \end{bmatrix}\right) = \begin{bmatrix} H(f_1) \\ H(f_2) \\ \ldots \\ H(f_{Nfrq}) \end{bmatrix}$$

Finally, in a fourth and last step 40, the coefficients $[\alpha_0; \alpha_1; \ldots; \alpha_{Nfir-1}]$ are calculated by matrix processing, in such a manner as to minimize the difference between the desired transfer function H and the approximate function $H_{approx}$. The calculation uses a first matrix E defined by:

$$E = \exp\left(-2i\pi \begin{bmatrix} f_1 & f_1^2 & \cdots & f_1^{Nfir-1} \\ f_2 & f_2^2 & \cdots & f_2^{Nfir-1} \\ \cdots & \cdots & \cdots & \cdots \\ f_{Nfrq} & f_{Nfrq}^2 & \cdots & f_{Nfrq}^{Nfir-1} \end{bmatrix}\right)$$

starting from which the coefficients of $H_{approx}$ are calculated with the following formula:

$$\begin{bmatrix} \alpha_0 \\ \alpha_1 \\ \alpha_2 \\ \cdots \\ \alpha_{Nfir-1} \end{bmatrix} = [E^T E]^{-1} [E^T H_{ref}]|$$

Figure 19:
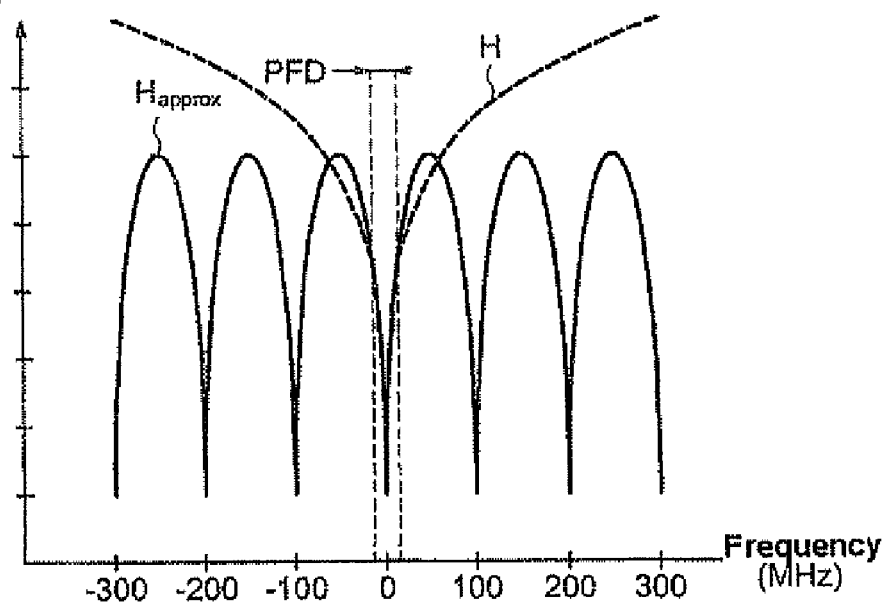
Figure 20:
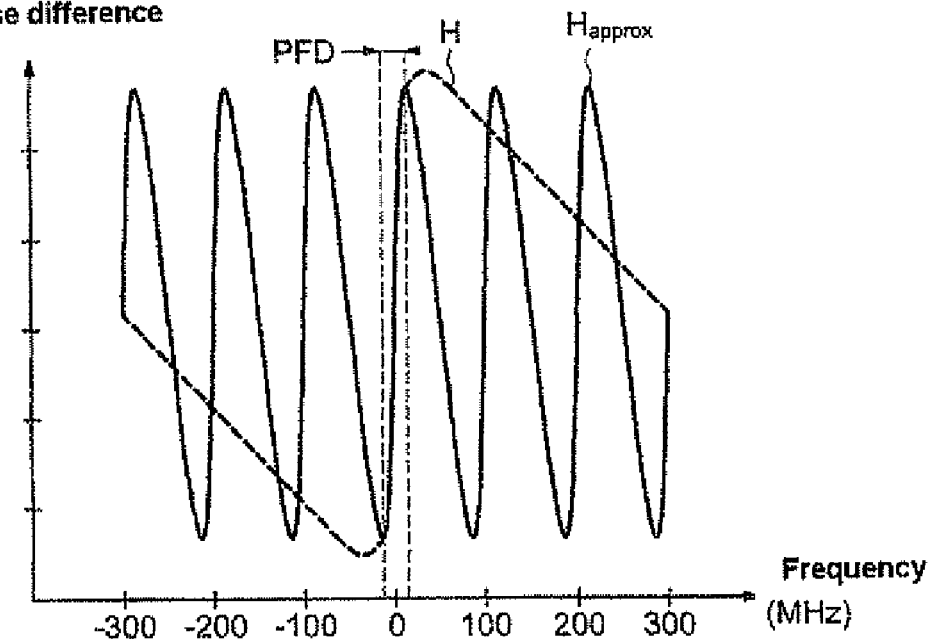

FIGS. 19 and 20 illustrate graphically an example of approximation of a transfer function H by a filter FIR of order 3 ($N_{fir}=3$), clocked at a frequency 6 times lower ($N_{div}=6$), and of transfer function $H_{approx}$. FIG. 19 shows the modulus of the two transfer functions and FIG. 20 shows the phase difference. It is observed that, over the frequency range PFD [−10 MHz; 10 MHz] representing one frequency channel, the curves have similar values.

In a third embodiment, the case is considered in which the filter FRFI is also run at a working frequency $F_S/N_{div}$ different from the sampling frequency $F_S$ of the analog/digital converter CANI, and the filter FPBAI is a low-pass filter of order 1 and of cutoff frequency $f_0$. As previously, the transfer function of the reformatting filter FRFI is an approximation $H_{approx}$ of the inverse H of the transfer function of the filter FPBAI. It will also be considered that the filter FRFI is of the finite-impulse-response type of order $N_{fir}=2N-1$. The transfer function $H_{approx}$ of the filter FRFI can be written in the form:

$$H_{approx} = 1 + \sum_{n=1}^{n=N-1} \alpha_n(z^n - z^{-n}) \text{ with } z^{-n} = e^{2i\pi n \frac{f}{N_{div} F_S}}$$

which corresponds, with a shift of $z^{-N+1}$, to $$\sum_{m=0}^{m=N_{fir}-1} \alpha'_m z^{-m}.$$

The determination of the approximate transfer function $H_{approx}$ comprises the determination of the coefficients $[\alpha_1; \ldots; \alpha_{N-1}]$. When the filter FPBAI is of order 1, the coefficients $[\alpha_1; \ldots; \alpha_{N-1}]$ may be calculated directly from the matrix equation:

$$\begin{bmatrix} 1 & 2 & \cdots & N \\ 1 & 8 & \cdots & N^3 \\ \cdots & \cdots & \cdots & \cdots \\ 1 & 2^{2N-3} & \cdots & N^{2N-3} \end{bmatrix} \begin{bmatrix} \alpha_1 \\ \alpha_2 \\ \cdots \\ \alpha_{N-1} \end{bmatrix} = \begin{bmatrix} F_S/2\pi N_{div} f_0 \\ 0 \\ \cdots \\ 0 \end{bmatrix}$$

Gives:
for $N_{fir}=3$:

$$H_{approx} = 1 + \frac{1}{4\pi} \frac{F_S}{N_{div} f_0}[z - z^{-1}]$$

which corresponds, with a time shift of $z^{-1}$, to:

$$\frac{1}{4\pi} \frac{F_S}{N_{div} f_0} + z^{-1} - \frac{1}{4\pi} \frac{F_S}{N_{div} f_0} z^{-2}.$$

for $N_{fir}=5$:

$$H_{approx} = 1 + \frac{1}{4\pi} \frac{F_S}{N_{div} f_0} \frac{1}{6}[-z^2 + 8z - 8z^{-1} + z^{-2}]$$

which corresponds, with a time shift of $z^{-2}$, to:

$$z^{-2} + \frac{1}{4\pi} \frac{F_S}{N_{div} f_0} \frac{1}{6}[-1 + 8z^{-1} - 8z^{-3} + z^{-4}]$$

for $N_{fir}=7$:

$$H_{approx} = 1 + \frac{1}{4\pi} \frac{F_S}{N_{div} f_0} \frac{1}{30}[z^3 - 9z^2 + 45z - 45z^{-1} + 9z^{-2} - z^{-3}]$$

which corresponds, with a time shift of $z^{-3}$, to:

$$z^{-3} + \frac{1}{4\pi} \frac{F_S}{N_{div} f_0} \frac{1}{30}[1 - 9z^{-1} + 45z^{-2} - 45z^{-4} + 9z^{-5} - z^{-6}]$$

The order $N_{fir}$ of the filter FRFI makes it possible to adjust, over the desired frequency range, the approximation of the inverse of the transfer function of the filter FPBAI.

It is therefore notably possible to transfer the difficulty in design of filters and of the analog-digital converter to the digital part, whatever the working frequency of the digital filters and the sampling frequency of the converter.

The invention claimed is:

1. A method for processing an incident signal comprising: delivering an incident signal to a transconductor stage; and coupling a current output of the transconductor stage to an output capacitor to deliver to the output capacitor a current signal lasting for at least part of a first half-period of each period of a periodic signal to obtain a frequency-transposed signal at the output capacitor so that, upon an occurrence of each part of the first half-period, the voltage of the current output, seen from the output capacitor, is reset to a value equal to that of the voltage of the output capacitor.

2. A method according to claim 1 wherein the current signal and its opposite are delivered, respectively, during two half-periods of each period of the period signal; and wherein the voltage of the current output is reset upon an occurrence of each half-period of the periodic signal.

3. A method according to claim 2 wherein the transconductor stage comprises first and second current outputs respectively delivering two opposite current signals; and wherein upon each first half-period of the periodic signal, the first current output is connected to the output capacitor, and upon each second half-period of the periodic signal, the second current output is connected to the output capacitor; and wherein resetting the voltage of the current output comprises resetting the voltage of the first current output, at least at the end of each second half-period of the periodic signal, to a value equal to that of the voltage of the output capacitor, and resetting the voltage of the second current output, at least at the end of each first half-period of the periodic signal, to a value equal to that of the voltage of the output capacitor.

4. A method according to claim 3 wherein the voltage of one of the first and second current outputs is reset to a value equal to that of the voltage of the output capacitor during a preceding half-period of the periodic signal.

5. A method according to claim 3 wherein the voltage of one of the first and second current outputs is reset to a value equal to that of the voltage of the output capacitor by an amplifier stage configured as a follower between the output capacitor and the respective current output.

6. A method according to claim 3 wherein the first and second current outputs of the transconductor stage comprise differential outputs.

7. A method according to claim 2 wherein the transconductor stage comprises a single current output delivering a current signal; wherein each first half-period of the periodic signal comprises a first part during which the current output is connected to the output capacitor, and each second half-period of the periodic signal comprises a first part during which the current output is connected to the output capacitor in a reverse manner to that carried out during the first part of the first half-period of the periodic signal; and wherein the resetting of the voltage of the current output comprises resetting the voltage of the current output to the inverse value to the voltage of the output capacitor at least at the end of the second part of each first half-period of the periodic signal, and resetting the voltage of the current output to the value of the voltage of the output capacitor at least at the end of the second part of each second half-period of the periodic signal.

8. A method according to claim 7 wherein the voltage of the current output is reset during a whole of the second part of the corresponding half-period of the periodic signal.

9. A method according to claim 7 wherein the voltage of the current output is reset by an amplifier stage configured as a follower between the output capacitor and the current output.

10. A method according to claim 7 wherein the current output of the transconductor stage comprises a differential output.

11. A method according to claim 1 wherein the voltage of the current output is reset at the end of a second half-period of the periodic signal.

12. A method according to claim 11 wherein the voltage of the current output is reset during the second half-period of the periodic signal.

13. A method according to claim 11 wherein the voltage of the current output is reset by an amplifier stage configured as a follower between the output capacitor and the current output.

14. A method according to claim 1 wherein the incident signal is a radio frequency signal and the transconductor stage comprises at least part of a low-noise amplifier stage.

15. A method according to claim 1 wherein the output capacitor forms at least part of an analog filter to filter the frequency components of the transposed signal outside of a desired frequency range, and further comprising:
converting the filtered transposed signal into a digital signal,
reformatting the digital signal into a form based upon, at least within the desired frequency range, a form of the frequency-transposed signal, and
digitally filtering the reformatted digital signal to filter the frequency components located outside of the desired frequency range.

16. A method according to claim 15 wherein the reformatting is carried out within a digital signal-conditioning filter having a working frequency equal to a sampling frequency of the conversion and a transfer function being inverse of the transfer function of the analog filtering, at least within the desired frequency range.

17. A method according to claim 16 wherein the reformatting and the final digital filtering are carried out within a same filter whose transfer function is, at least within the desired frequency range, based upon a product of a transfer function of the digital signal-conditioning and a transfer function of the digital filter.

18. A method according to claim 15 wherein the reformatting is carried out within a digital signal-conditioning filter having a working frequency lower than a sampling frequency of the conversion, and a transfer function whose coefficients result from an approximation of an inverse of the transfer function of the analog filtering, at least within the desired frequency range.

19. A method according to claim 18 wherein a determination of the coefficients comprises a selection of reference frequencies chosen within the desired frequency range and, for each of these reference frequencies, a minimization of a difference between a corresponding value of the inverse of the transfer of the analog filtering and a corresponding value of the transfer function of the signal-conditioning filter.

20. A method according to claim 19 wherein the reference frequencies are chosen in a uniform manner within the desired frequency range.

21. A method according to claim 18 wherein the analog filtering comprises a first order analog filtering; and wherein the approximation of the inverse of the transfer function of the analog filtering is based upon an order of the digital signal-conditioning filter.

22. A method according to claim 19 wherein the digital signal-conditioning filter comprises a finite-impulse-response filter.

23. A device for processing an incident signal comprising:
a transconductor stage including an input for receiving the incident signal and a current output;
an output capacitor;
frequency-transposition circuitry coupled between said transconductor stage and said output capacitor and comprising
generation circuitry to generate a periodic signal,
a set of switches configurable in response to a control signal, and control circuitry to deliver the control signal based upon the periodic signal for configuring said set of switches to couple said current output of said transconductor stage to said output capacitor and to respectively deliver to said output capacitor a current signal lasting for at least part of a first half-period of each period of the periodic signal to obtain at said output capacitor a frequency-transposed signal; and reset circuitry to reset, upon an occurrence of each part of the first half-period of the periodic signal, the voltage of said current output, as seen from said output capacitor, to a value equal to that of the voltage of said output capacitor.

24. A device according to claim 23 wherein said control circuitry delivers a current signal and its opposite during two half-periods of each period of the periodic signal; and wherein the voltage of said current output is reset upon an occurrence of each half-period of the periodic signal.

25. A device according to claim 24 wherein said transconductor stage comprises first and second current outputs respectively delivering two current signals of opposing sign; wherein said set of switches has a first state in which it couples said first current output to said output capacitor and a second state in which it couples said second current output to said output capacitor; wherein said control circuitry is to deliver the control signal to configure said set of switches to the first state during each first half-period of the periodic signal and to the second state during each second half-period of the periodic signal; and wherein said reset circuitry resets the voltage of said first current output to the value of the voltage of said output capacitor at an end of each second half-period of the periodic signal, and resets the voltage of said second current output at the value of the voltage of said output capacitor at an end of each first half-period of the periodic signal.

26. A device according to claim 25 wherein said reset circuitry comprises an additional set of switches configurable in response to an additional control signal, and additional control circuitry to deliver the additional control signal based upon the periodic signal, said additional set of switches having a first state in which it couples said output capacitor to said second current output and a second state in which it couples said output capacitor to said first current output, said additional control circuitry to deliver the additional control signal to configure said additional set of switches to the first state at the end of each first half-period of the periodic signal and to the second state at the end of each second half-period of the periodic signal.

27. A device according to claim 26 wherein said additional control circuitry is to deliver the additional control signal to configure said additional set of switches to the first state and the second state during the whole of the first half-period and the whole of the second half-period of the periodic signal, respectively.

28. A device according to claim 27 wherein said transconductor stage comprises a single current output to deliver the current signal; wherein said set of switches has a first state in which it couples said current output to said output capacitor, a second state in which it coupled, in a reverse manner to that of the first state, said current output to said output capacitor, and a third state in which it electrically decouples said current output from said output capacitor; wherein said control circuitry to deliver the control signal to configure said set of switches to the first state during the first part of each first half-period of the periodic signal, to the second state during the first part of each second half-period of the periodic signal and in the third state during the second part of each first half-period and second half-period of the periodic signal; and wherein said reset circuitry is to reset the voltage of said current output to an inverse of the value of the voltage of said output capacitor at the end of the second part of each first half-period of the periodic signal, and reset the voltage of said current output at the value of the voltage of said output capacitor at the end of the second part of each second half-period of the periodic signal.

29. A device according to claim 28 wherein said reset circuitry comprises an additional set of switches configurable in response to an additional control signal; and further comprising additional control circuitry to deliver the additional control signal based upon the periodic signal, said additional set of switches having a first state in which it couples said output capacitor to said current output, a second state in which it couples, in a reverse manner to that in the first state, said output capacitor to said current output, and a third state in which it electrically decouples said output capacitor from said current output, said additional control circuitry to deliver the additional control signal to configure said additional set of switches in the first state at the end of the second part of each first half-period of the periodic signal, in the second state at the end of the second part of each second half-period of the periodic signal, and in the third state during the first part of each first and second half-period of the periodic signal.

30. A device according to claim 29 wherein said additional control circuitry is to deliver the additional control signal to configure said additional set of switches in the first state and the second state, during the whole of the second part of the first half-period of the periodic signal and the second half-period of the periodic signal, respectively.

31. A device according to claim 23 wherein said transconductor stage further comprises a current output to deliver the current signal; wherein the set of configurable switches has a first state in which it couples said current output to said output capacitor and a second state in which it electrically decouples said current output from said output capacitor; and wherein said control circuitry is to deliver the control signal to configure said set of switches to the first state during each first half-period of the periodic signal and in the second state during each second half-period of the periodic signal; and wherein the resetting circuitry is to reset the voltage of said current output to the value of the voltage of said output capacitor at the end of the second half-period of the periodic signal.

32. A device according to claim 31 wherein the resetting circuitry comprises an additional set of switches configurable in response to an additional control signal and additional control circuitry to deliver the additional control signal based upon the periodic signal, said additional set of switches having a first state in which it couples said output capacitor to said current output, a second state in which it electrically decouples said output capacitor from said current output, said additional control circuitry to deliver the additional control signal to configure said additional set of switches to the first state at the end of each second half-period of the periodic signal and in the second state during each first half-period of the periodic signal.

33. A device according to claim 32 wherein said reset circuitry further comprises an amplifier stage configured as a follower and coupled between said output capacitor and said current output by said additional set of switches.

34. A device according to claim 23 wherein said current outputs of said transconductor stage comprise differential outputs.

35. A device according to claim 23 wherein said output capacitor forms at least part of an analog filter to filter the frequency-transposed signal in such a manner as to filter frequency components situated outside of a desired frequency range; and wherein the device further comprises an analog/digital converter to convert the filtered transposed signal into a digital signal, reformatting circuitry to reformat the digital signal into a form based upon the initial form of the current signal, at least within the desired frequency range, and additional filtering circuitry to carry out a final digital filtering of the reconditioned digital signal to filter frequency components situated outside of the desired frequency range.

36. A device according to claim 35 wherein the reformatting circuitry comprises a reformatting digital filter having a working frequency equal to a sampling frequency of the conversion and having a transfer function inverse of the transfer function of the analog filter, at least within the desired frequency range.

37. A device according to claim 35 wherein the reformatting circuitry comprises a reformatting digital filter having a working frequency lower than the sampling frequency of the conversion and having a transfer function resulting from an approximation of an inverse of the transfer function of the analog filter at least within the desired frequency range.

38. A device according to claim 37 wherein the digital reformatting filter has a transfer function having coefficients resulting from an approximation of an inverse of the transfer function of the analog filtering, at least on the desired frequency range, the coefficients determined such that, for each frequency taken in a group of reference frequencies chosen within a frequency range, a difference between corresponding values of a transfer function inverse to that of the analog filter and a corresponding value of the digital reformatting filter is minimal.

39. A device according to claim 38 wherein the digital reformatting comprises a finite impulse response filter.

40. A device according to claim 37 wherein the analog filtering comprises a first order analog filtering and wherein the approximation of the inverse of the transfer function of the analog filtering depends on an order of the digital reformatting filter.

41. A device according to claim 37 wherein the reformatting circuitry and the additional filtering circuitry comprise a same filter whose transfer function is equal to a product of a transfer function of the reformatting and a transfer function of the additional filtering circuitry.

42. A device according to claim 23 wherein the device is fabricated in the form of an integrated circuit.

43. A device according to claim 23 wherein said transconductor stage, output capacitor, frequency transposition circuitry, and reset circuitry are configured to define a radio frequency signal receiver.

44. A device for processing an incident signal comprising:

a transconductor stage including an input for receiving the incident signal and a current output;

frequency-transposition circuitry coupled between said transconductor stage and said output capacitor and comprising a set of switches configurable in response to a control signal, and control circuitry to deliver the control signal based upon a periodic signal for configuring said set of switches to couple said current output of said transconductor stage to an output capacitor and to respectively deliver to said output capacitor a current signal lasting for at least part of a first half-period of each period of the periodic signal to obtain at said output capacitor a frequency-transposed signal; and reset circuitry to reset, upon an occurrence of each part of the first half-period of the periodic signal, the voltage of said current output, as seen from said output capacitor1 to a value equal to that of the voltage of said output capacitor.

45. A device according to claim 44 wherein said transconductor stage further comprises a current output to deliver the current signal; wherein the set of configurable switches has a first state in which it couples said current output to said output capacitor and a second state in which it electrically decouples said current output from said output capacitor; and wherein said control circuitry is to deliver the control signal to configure said set of switches to the first state during each first half-period of the periodic signal and in the second state during each second half-period of the periodic signal; and wherein the resetting circuitry is to reset the voltage of said current output to the value of the voltage of said output capacitor at the end of the second half-period of the periodic signal.

46. A device according to claim 45 wherein the resetting circuitry comprises an additional set of switches configurable in response to an additional control signal and additional control circuitry to deliver the additional control signal based upon the periodic signal, said additional set of switches having a first state in which it couples said output capacitor to said current output, a second state in which it electrically decouples said output capacitor from said current output, said additional control circuitry to deliver the additional control signal to configure said additional set of switches to the first state at the end of each second half-period of the periodic signal and in the second state during each first half-period of the periodic signal.

* * * * *

UNITED STATES PATENT AND TRADEMARK OFFICE
CERTIFICATE OF CORRECTION

PATENT NO.      : 7,671,780 B2                                    Page 1 of 1
APPLICATION NO. : 12/015070
DATED           : March 2, 2010
INVENTOR(S)     : Joet et al.

It is certified that error appears in the above-identified patent and that said Letters Patent is hereby corrected as shown below:

| | |
|---|---|
| Column 8, Line 17 | Delete: "Signal" <br> Insert: --signal-- |
| Column 10, Line 4 | Delete: "90o" <br> Insert: --90°-- |
| Column 14, Line 41 | Delete: "21" <br> Insert: --P1-- |
| | Delete: "22" <br> Insert: --P2-- |
| Column 23, Line 59 | Delete: "coupled" <br> Insert: --couples-- |
| Column 26, Line 20 | Delete: "capacitor1" <br> Insert: --capacitor,-- |

Signed and Sealed this

Seventh Day of September, 2010

David J. Kappos
*Director of the United States Patent and Trademark Office*